US012809584B2

(12) United States Patent
Ishizu et al.

(10) Patent No.: US 12,809,584 B2
(45) Date of Patent: Nov. 24, 2026

(54) SEMICONDUCTOR DEVICE

(71) Applicant: Semiconductor Energy Laboratory Co., Ltd., Atsugi (JP)

(72) Inventors: Takahiko Ishizu, Sagamihara (JP); Takeshi Aoki, Ebina (JP); Kazuma Furutani, Atsugi (JP); Takayuki Ikeda, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1282 days.

(21) Appl. No.: 17/762,852

(22) PCT Filed: Sep. 18, 2020

(86) PCT No.: PCT/IB2020/058696

§ 371 (c)(1),
(2) Date: Mar. 23, 2022

(87) PCT Pub. No.: WO2021/064502

PCT Pub. Date: Apr. 8, 2021

(65) Prior Publication Data

US 2022/0276839 A1 Sep. 1, 2022

(30) Foreign Application Priority Data

Oct. 4, 2019 (JP) ................................. 2019-183393
Oct. 18, 2019 (JP) ................................. 2019-190753

(51) Int. Cl.
*G06F 7/544* (2006.01)
*H10D 30/67* (2025.01)

(52) U.S. Cl.
CPC ....... *G06F 7/5443* (2013.01); *H10D 30/6755* (2025.01)

(58) Field of Classification Search
CPC ................. H10D 30/6755; G06N 3/06; G06N 3/063–065; G06F 15/7821; G06F 7/5443
See application file for complete search history.

(56) References Cited

U.S. PATENT DOCUMENTS 8,792,284 B2 7/2014 Ohnuki
9,263,473 B2 2/2016 Ohnuki
(Continued)

FOREIGN PATENT DOCUMENTS

CN 111033438 A 4/2020
DE 112018004814 6/2020
(Continued)

OTHER PUBLICATIONS

International Search Report (Application No. PCT/IB2020/058696) Dated Dec. 28, 2020.
(Continued)

*Primary Examiner* — Matthew D Sandifer
(74) *Attorney, Agent, or Firm* — Eric J. Robinson; Robinson Intellectual Property Law Office, P.C.

(57) ABSTRACT

A semiconductor device includes a CPU and an accelerator that includes a first memory circuit, a driver circuit, and a product-sum operation circuit. The first memory circuit includes a first data retention portion, a second data retention portion, and a data reading portion. The first data retention portion, the second data retention portion, and the data reading portion each include a first transistor. The first transistor contains a metal oxide in a channel formation region. First data stored in the first data retention portion and second data stored in the second data retention portion are each weight data input to the product-sum operation circuit. The product-sum operation circuit has a function of performing product-sum operation of the weight data and input data input through the driver circuit. The product-sum operation circuit and the driver circuit each include a second (Continued)

transistor. The second transistor contains silicon in a channel formation region. The first transistor and the second transistor are stacked.

10 Claims, 26 Drawing Sheets

(56) References Cited

U.S. PATENT DOCUMENTS

| | | | | |
|---|---|---|---|---|
| 9,716,852 | B2 | 7/2017 | Kurokawa | |
| 9,748,274 | B2 | 8/2017 | Ishizu et al. | |
| 9,848,144 | B2 | 12/2017 | Okamoto. et al. | |
| 9,851,942 | B2 | 12/2017 | Kurokawa | |
| 9,934,826 | B2 | 4/2018 | Kurokawa | |
| 10,204,925 | B2 | 2/2019 | Yoneda | |
| 11,099,814 | B2 | 8/2021 | Harada et al. | |
| 11,275,993 | B2 | 3/2022 | Ishizu et al. | |
| 11,314,484 | B2 * | 4/2022 | Kozuma | G06F 7/60 |
| 11,335,813 | B2 | 5/2022 | Kobayashi et al. | |
| 12,190,079 | B2 | 1/2025 | Kozuma et al. | |
| 2016/0343452 | A1 * | 11/2016 | Ikeda | H10D 86/481 |
| 2017/0263291 | A1 * | 9/2017 | Kurokawa | G06F 7/00 |
| 2017/0301376 | A1 * | 10/2017 | Kurokawa | G11C 5/063 |
| 2017/0317085 | A1 * | 11/2017 | Kurokawa | G06V 40/1306 |
| 2018/0018565 | A1 | 1/2018 | Kurokawa | |
| 2020/0250521 | A1 | 8/2020 | Ishizu et al. | |
| 2022/0276834 | A1 * | 9/2022 | Aoki | G06F 7/5443 |

FOREIGN PATENT DOCUMENTS

| | | | | |
|---|---|---|---|---|
| JP | 2017107558 | A * | 6/2017 | G11C 8/12 |
| JP | 2018-018569 | A | 2/2018 | |
| JP | 2018-129046 | A | 8/2018 | |
| JP | 2018-180975 | A | 11/2018 | |
| JP | 2019-033234 | A | 2/2019 | |
| JP | 2019-036280 | A | 3/2019 | |
| JP | 2019-046199 | A | 3/2019 | |
| JP | 2019-047006 | A | 3/2019 | |
| KR | 2012-0022612 | A | 3/2012 | |
| KR | 2016-0010317 | A | 1/2016 | |
| KR | 2016-0138910 | A | 12/2016 | |
| KR | 2017-0068511 | A | 6/2017 | |
| KR | 2020-0050949 | A | 5/2020 | |
| WO | WO-2016/055894 | | 4/2016 | |
| WO | WO-2018/211349 | | 11/2018 | |
| WO | WO-2019/048982 | | 3/2019 | |
| WO | WO-2019/078924 | | 4/2019 | |

OTHER PUBLICATIONS

Written Opinion (Application No. PCT/IB2020/058696) Dated Dec. 28, 2020.

Matsubara.K et al., "A 65nm Silicon-on-Thin-Box (SOTB) Embedded 2T-MONOS Flash Achieving 0.22 pJ/bit Read Energy with 64 MHz Access for IoT Applications", 2019 Symposium on VLSI Circuits Digest of Technical Papers, Jun. 9, 2019, pp. 202-203.

* cited by examiner

FIG. 19A
Intermediate state
New crystalline phase
| Amorphous | Crystalline | Crystal |
|---|---|---|
| ▪completely amorphous | ▪CAAC<br>▪nc<br>▪CAC<br>excluding single crystal and poly crystal | ▪single crystal<br>▪poly crystal |
FIG. 19B
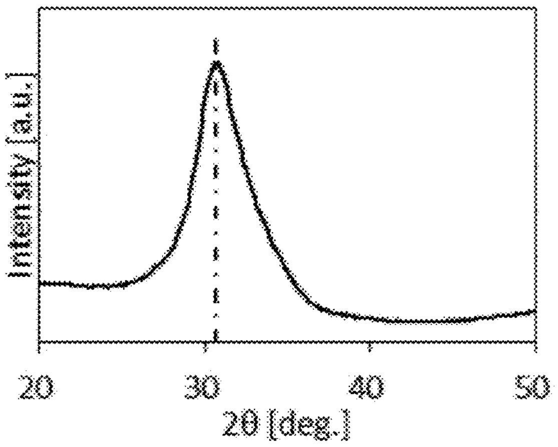
FIG. 19C
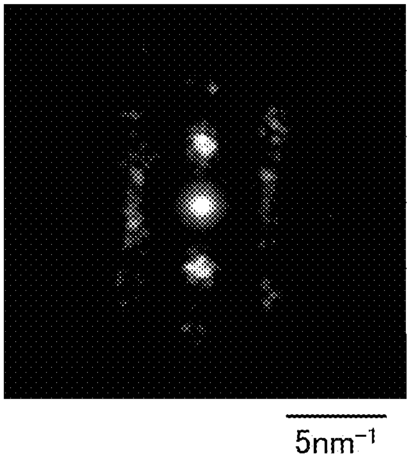

SEMICONDUCTOR DEVICE

TECHNICAL FIELD

In this specification, a semiconductor device and the like are described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a storage device, a display system, an electronic device, a lighting device, an input device, an input/output device, a driving method thereof, and a manufacturing method thereof.

BACKGROUND ART

Electronic devices each including a semiconductor device including a CPU (Central Processing Unit) or the like have been widely used. In such electronic devices, techniques for improving the performance of the semiconductor devices have been actively developed to process a large volume of data at high speed. As a technique for achieving high performance, what is called an SoC (System on Chip) is given in which an accelerator such as a GPU (Graphics Processing Unit) and a CPU are tightly coupled. In the semiconductor device having higher performance by adopting an SoC, heat generation and an increase in power consumption become problems.

AI (Artificial Intelligence) technology requires a large amount of calculation and a large number of parameters and thus the amount of arithmetic operations is increased. An increase in the amount of arithmetic operations causes heat generation and an increase in power consumption. Thus, architectures for reducing the amount of arithmetic operations have been actively proposed. Typical architectures are Binary Neural Network (BNN) and Ternary Neural Network (TNN), which are effective especially in reducing circuit scale and power consumption (see Patent Document 1, for example).

For example, in TNN, data that is originally expressed with 32-bit or 16-bit precision is compressed to ternary data of "+1", "0", or "−1", whereby the amount of calculation and the number of parameters can be greatly reduced. In BNN, data that is originally expressed with 32-bit or 16-bit precision is compressed to binary data of "+1" or "−1", whereby the amount of calculation and the number of parameters can be greatly reduced. BNN and TNN are effective in reducing circuit scale and power consumption and thus thought to be compatible with applications that are required to have low power consumption in limited hardware resources.

REFERENCE

Patent Document

[Patent Document 1] PCT International Publication No. 2019/078924

SUMMARY OF THE INVENTION

Problems to be Solved by the Invention

Ternary data is used for a TNN arithmetic operation. In the case where ternary data is stored in an SRAM (Static RAM), the number of transistors in a memory cell is increased. Thus, downsizing of a semiconductor device might be difficult. In addition, as scaling down of the transistor advances, power consumption due to leakage current of the transistor is increased, which may lead to an issue of increasing the total amount of power consumption of the semiconductor device.

In the product-sum operation of fully connected neural networks, the frequency of reading data from memory during arithmetic operation is increased; thus, how to reduce the charge/discharge energy of a bit line is important for reducing power consumption. In the case where the bit line is shortened for reducing the charge/discharge energy of the bit line, the area of a memory cell array is increased, which may lead to an issue of significantly increasing the area of peripheral circuits. In the case of employing a technology of three-dimensional integration of memory cell arrays with a bonding technique or the like for the purpose of shortening the bit line, the parasitic capacitance or the like is increased actually because of large spaces between connection portions for electrically connecting the memory cell arrays, which may inhibit a reduction in the charge/discharge energy.

An object of one embodiment of the present invention is to provide a small semiconductor device. Another object of one embodiment of the present invention is to provide a semiconductor device with low power consumption. Another object is to provide a semiconductor device with a novel structure.

One embodiment of the present invention does not necessarily achieve all the above objects and only needs to achieve at least one of the objects. The descriptions of the above objects do not preclude the existence of other objects. Objects other than these objects will be apparent from the descriptions of the specification, the claims, the drawings, and the like, and objects other than these objects can be derived from the descriptions of the specification, the claims, the drawings, and the like.

Means for Solving the Problems

One embodiment of the present invention is a semiconductor device including a CPU and an accelerator that includes a first memory circuit, a driver circuit, and a product-sum operation circuit. The first memory circuit includes a first data retention portion, a second data retention portion, and a data reading portion. The first data retention portion, the second data retention portion, and the data reading portion each include a first transistor. The first transistor includes a first semiconductor layer containing a metal oxide in a channel formation region. First data stored in the first data retention portion and second data stored in the second data retention portion are each weight data input to the product-sum operation circuit. The product-sum operation circuit has a function of performing product-sum operation of the weight data and input data input through the driver circuit. The product-sum operation circuit and the driver circuit each include a second transistor. The second transistor includes a second semiconductor layer containing silicon in a channel formation region. The first transistor and the second transistor are stacked.

One embodiment of the present invention is a semiconductor device including a CPU and an accelerator that includes a first memory circuit, a driver circuit, and a product-sum operation circuit. The first memory circuit includes a first data retention portion, a second data retention portion, and a data reading portion. The first data retention portion, the second data retention portion, and the data reading portion each include a first transistor. The first transistor includes a first semiconductor layer containing a metal oxide in a channel formation region. First data stored in the first data retention portion and second data stored in the second data retention portion are each weight data input to the product-sum operation circuit. The product-sum operation circuit has a function of performing product-sum operation of the weight data and input data input through the driver circuit. The product-sum operation circuit and the driver circuit each include a second transistor. The second transistor includes a second semiconductor layer containing silicon in a channel formation region, a well region containing an impurity element imparting conductivity, and an oxide layer in contact with the well region and the second semiconductor layer. The first transistor and the second transistor are stacked.

One embodiment of the present invention is a semiconductor device including a CPU and an accelerator that includes a first memory circuit, a driver circuit, and a product-sum operation circuit. The first memory circuit includes a first data retention portion, a second data retention portion, and a data reading portion. The first data retention portion, the second data retention portion, and the data reading portion each include a first transistor. The first transistor includes a first semiconductor layer containing a metal oxide in a channel formation region. First data stored in the first data retention portion and second data stored in the second data retention portion are each weight data input to the product-sum operation circuit. The product-sum operation circuit has a function of performing product-sum operation of the weight data and input data input through the driver circuit. The product-sum operation circuit and the driver circuit each include a second transistor. The second transistor includes a second semiconductor layer containing silicon in a channel formation region. The CPU includes a CPU core including a flip-flop provided with a backup circuit. The backup circuit includes a third transistor. The third transistor includes a third semiconductor layer containing a metal oxide in a channel formation region. The first transistor and the third transistor are stacked with the second transistor.

One embodiment of the present invention is a semiconductor device including a CPU and an accelerator that includes a first memory circuit, a driver circuit, and a product-sum operation circuit. The first memory circuit includes a first data retention portion, a second data retention portion, and a data reading portion. The first data retention portion, the second data retention portion, and the data reading portion each include a first transistor. The first transistor includes a first semiconductor layer containing a metal oxide in a channel formation region. First data stored in the first data retention portion and second data stored in the second data retention portion are each weight data input to the product-sum operation circuit. The product-sum operation circuit has a function of performing product-sum operation of the weight data and input data input through the driver circuit. The product-sum operation circuit and the driver circuit each include a second transistor. The second transistor includes a second semiconductor layer containing silicon in a channel formation region, a well region containing an impurity element imparting conductivity, and an oxide layer in contact with the well region and the second semiconductor layer. The CPU includes a CPU core including a flip-flop provided with a backup circuit. The backup circuit includes a third transistor. The third transistor includes a third semiconductor layer containing a metal oxide in a channel formation region. The first transistor and the third transistor are stacked with the second transistor.

In the semiconductor device of one embodiment of the present invention, the backup circuit preferably has a function of retaining data stored in the flip-flop in a state where supply of a power supply voltage is stopped when the CPU does not operate.

In the semiconductor device of one embodiment of the present invention, the first data retention portion and the second data retention portion preferably have a function of storing the first data and the second data when the first transistors are brought into an off state.

In the semiconductor device of one embodiment of the present invention, the first memory circuit is preferably electrically connected to a first bit line for reading the first data and a second bit line for reading the second data, and the first bit line and the second bit line are preferably electrically connected to the product-sum operation circuit through a first wiring provided to be perpendicular or substantially perpendicular to a surface of a substrate where the second transistor is provided.

In the semiconductor device of one embodiment of the present invention, the metal oxide preferably contains In, Ga, and Zn.

Note that other embodiments of the present invention will be shown in the description of the following embodiments and the drawings.

Effect of the Invention

One embodiment of the present invention can provide a small semiconductor device. Furthermore, one embodiment of the present invention can provide a semiconductor device with low power consumption. Furthermore, one embodiment of the present invention can provide a semiconductor device with a novel structure.

The description of a plurality of effects does not disturb the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 19A is a table showing classifications of crystal structures of IGZO. FIG. 19B is a graph showing an XRD spectrum of a CAAC-IGZO film. FIG. 19C is an image showing nanobeam electron diffraction patterns of a CAAC-IGZO film.

MODE FOR CARRYING OUT THE INVENTION

Figure 1A:
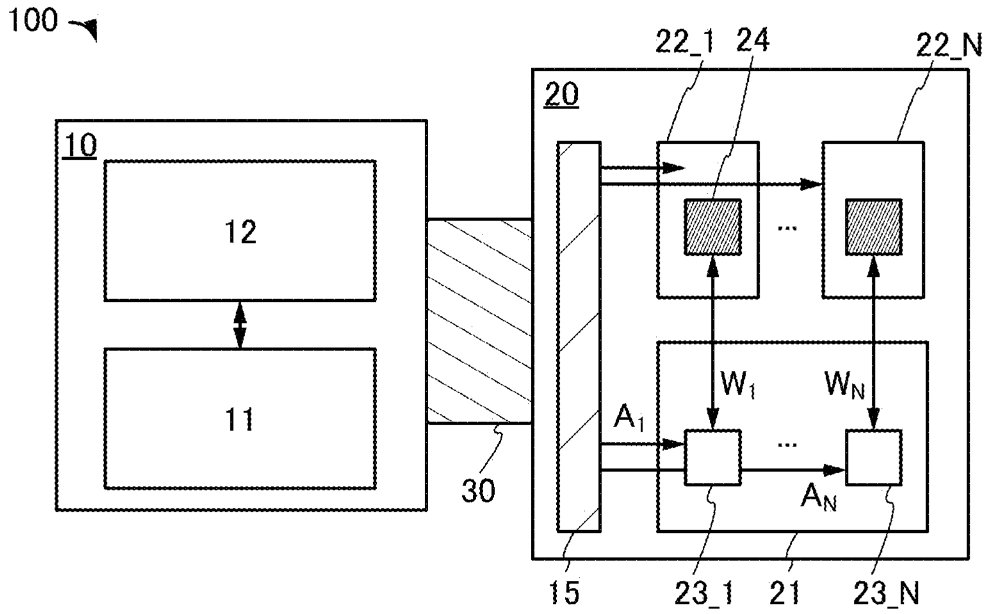
FIG. 1A and FIG. 1B are diagrams each illustrating a structure example of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. Furthermore, the ordinal numbers do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims The same components, components having similar functions, components made of the same material, components formed at the same time, and the like in the drawings are denoted by the same reference numerals, and repeated description thereof is skipped in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, a second wiring GL is referred to as a wiring GL[0].

Embodiment 1

Structures, operations, and the like of semiconductor devices of embodiments of the present invention will be described.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (e.g., a liquid crystal display device and a light-emitting display device), a projection device, a lighting device, an electro-optical device, a power storage device, a storage device, a semiconductor circuit, an imaging device, an electronic appliance, and the like include a semiconductor device.

Figure 1B:
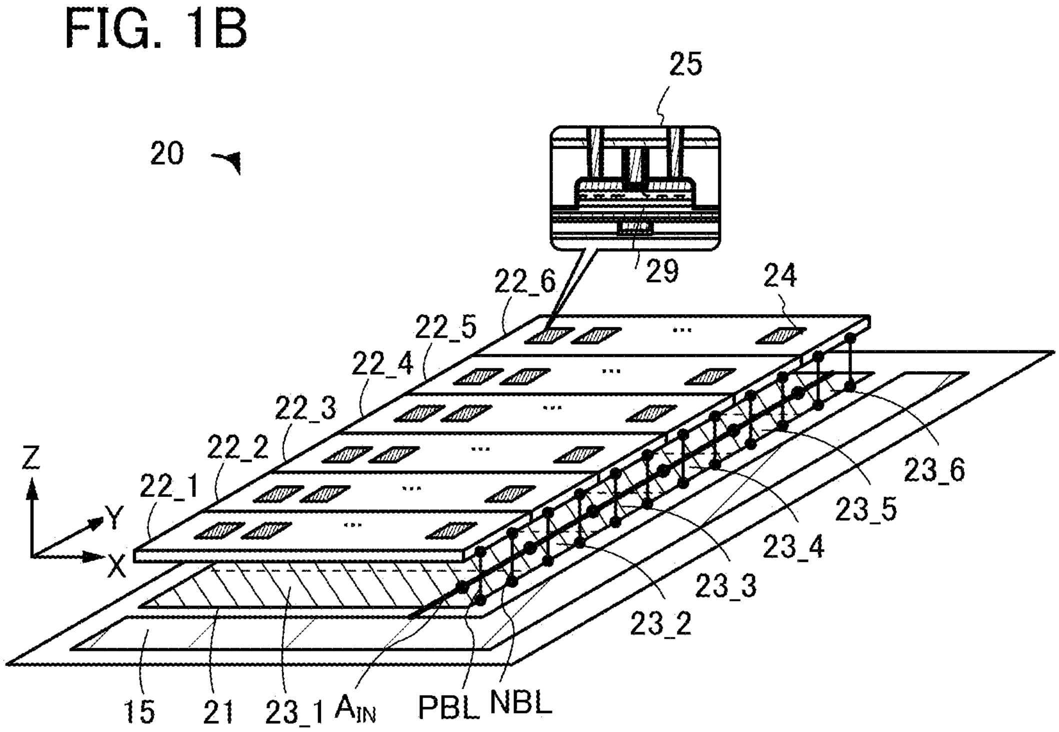

FIG. 1A and FIG. 1B are diagrams illustrating a semiconductor device 100 of one embodiment of the present invention. The semiconductor device 100 in FIG. 1A and FIG. 1B includes a CPU 10, an accelerator 20, and a bus 30, for example. The CPU 10 includes a CPU core 11 and a backup circuit 12. The accelerator 20 includes a driver circuit 15, an arithmetic processing portion 21, and memory portions 22_1 to 22_N (N is a natural number). The driver circuit 15 is a circuit for driving the memory portion 22. The arithmetic processing portion 21 includes arithmetic circuits 23_1 to 23_N. The driver circuit 15 is a circuit for driving the memory portions 22_1 to 22_N and the arithmetic processing portion 21. Each of the memory portions 22_1 to 22_N includes a memory circuit 24. The memory portions 22_1 to 22_N are each referred to as a device memory or a shared memory in some cases. The memory circuit 24 includes a transistor 25 including a semiconductor layer 29 including a channel formation region.

The CPU 10 has a function of performing general-purpose processing such as execution of an operating system, control of data, and execution of various arithmetic operations and programs. The CPU 10 includes the CPU core 11. The CPU core 11 corresponds to one or a plurality of CPU cores. The CPU 10 includes the backup circuit 12 that can retain data stored in the CPU core 11 even when the supply of power supply voltage is stopped. The supply of a power supply voltage can be controlled by electric isolation by a power switch or the like from a power domain. Note that a power supply voltage is referred to as a drive voltage in some cases. As the backup circuit 12, for example, a memory including a transistor (an OS transistor) containing an oxide semiconductor in a channel formation region is suitable.

The backup circuit 12 formed using an OS transistor can be stacked over the CPU core 11 that can be formed using a Si CMOS. The area of the backup circuit 12 is smaller than that of the CPU core 11; thus, the circuit area is not increased when the backup circuit 12 is provided over the CPU core. The backup circuit 12 has a function of retaining data of a register included in the CPU core 11. The backup circuit 12 is also referred to as a data retention circuit.

Note that a structure of the CPU core 11 provided with the backup circuit 12 including the OS transistor will be described in details in Embodiment 3.

The accelerator 20 has a function of executing a program (also referred to as kernel or a kernel program) called from a host program. The accelerator 20 can perform parallel processing of a matrix operation in graphics processing, parallel processing of a product-sum operation of a neural network, and parallel processing of a floating-point operation in a scientific computation, for example.

The memory portions 22_1 to 22_N have a function of storing data to be processed by the accelerator 20. Specifically, the memory portions 22_1 to 22_N can store weight data $W_1$ to $W_N$ used in the parallel processing of a product-sum operation of a neural network. The weight data $W_1$ to $W_N$ are data represented by three levels, "+1", "0", and "−1", used in TNN. In each memory circuit 24 included in the memory portions 22_1 to 22_N, binary voltage values are held in two data retention portions, whereby the three-level data can be retained. Note that without limitation on three-level data, the stored data can have four or more levels.

The arithmetic processing portion 21 and the memory portions 22_1 to 22_N are connected to a bit line PBL and a bit line NBL. Any one of the memory portions 22_1 to 22_N includes the memory circuit 24 connected to a pair of the bit line PBL and the bit line NBL. The pair of the bit line PBL and the bit line NBL is referred to as a bit line BL simply in some cases. The pair of the bit line PBL and the bit line NBL is connected to any one of the arithmetic circuits 23_1 to 23_N. The pair of the bit line PBL and the bit line NBL is a wiring for supplying the weight data $W_1$ to $W_N$ from the memory portion 22 (any one of the memory portions 22_1 to 22_N is referred to as the memory portion 22) to an arithmetic circuit 23 (any one of the arithmetic circuits 23_1 to 23_N is referred to as the arithmetic circuit 23).

The driver circuit 15 and the arithmetic processing portion 21 are connected to each other through a data input line $A_{IN}$. Any one of the arithmetic circuits 23_1 to 23_N is supplied with any one of input data $A_1$ to $A_N$ through the data input line $A_{IN}$. The input data $A_1$ to $A_N$ is the data represented by two levels, "+1" and "−1", used in TNN. The data input line $A_{IN}$ is a wiring for supplying the input data $A_1$ to $A_N$ to the arithmetic circuit 23. With this structure, arithmetic processing based on the architecture such as Ternary Neural Network (TNN) can be efficiently performed in the arithmetic processing portion 21.

In the memory circuit 24, the semiconductor layer 29 in the transistor 25 is an oxide semiconductor. That is, the transistor 25 is an OS transistor. A memory including an OS transistor (hereinafter, also referred to as an OS memory) is suitable for the memory circuit 24. The OS memory has a function of retaining electric charge corresponding to a voltage value when the OS transistor is turned off.

A metal oxide has a band gap of 2.5 eV or wider; thus, an OS transistor has an extremely low off-state current. For example, the off-state current per micrometer in channel width at a source-drain voltage of 3.5 V and room temperature (25° C.) can be lower than $1\times10^{-20}$ A, lower than $1\times10^{-22}$ A, or lower than $1\times10^{-24}$ A. That is, the on/off ratio of drain current can be greater than or equal to 20 digits and less than or equal to 150 digits. Therefore, in an OS memory, the amount of electric charge that leaks from a retention node through the OS transistor is extremely small. Accordingly, the OS memory can function as a nonvolatile memory circuit; thus, power gating of the accelerator is enabled.

A highly integrated semiconductor device generates heat due to circuit drive in some cases. This heat makes the temperature of a transistor rise to change the characteristics of the transistor, and the field-effect mobility thereof might change or the operation frequency thereof might decrease, for example. Since an OS transistor has a higher heat resistance than a Si transistor, the field-effect mobility is less likely to change and the operation frequency is less likely to decrease due to a temperature change. Even when the temperature becomes high, an OS transistor is likely to keep a property of the drain current increasing exponentially with respect to a gate-source voltage. Thus, the use of an OS transistor enables stable operation in a high-temperature environment.

A metal oxide used for an OS transistor is Zn oxide, Zn—Sn oxide, Ga—Sn oxide, In—Ga oxide, In—Zn oxide, In-M-Zn oxide (M is one or more metals selected from Ti, Ga, Y, Zr, La, Ce, Nd, Sn, and Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer is a metal oxide having a crystal portion such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, a high on-state current and an extremely low off-state current can be both achieved.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an OS transistor can be driven with a high drain voltage.

An OS transistor is an accumulation transistor in which electrons are majority carriers. Therefore, DIBL (Drain-Induced Barrier Lowering), which is one of short-channel effects, affects an OS transistor less than an inversion transistor having a pn junction (typically a Si transistor). In other words, an OS transistor has higher resistance against short channel effects than a Si transistor.

Owing to its high resistance against short channel effects, an OS transistor can have a reduced channel length without deterioration in reliability, which means that the use of an OS transistor can increase the degree of integration in a circuit. Although a reduction in channel length enhances a drain electric field, avalanche breakdown is less likely to occur in an OS transistor than in a Si transistor as described above.

Since an OS transistor has a high resistance against short-channel effects, a gate insulating film can be made thicker than that of a Si transistor. For example, even in a minute OS transistor whose channel length and channel width are less than or equal to 50 nm, a gate insulating film as thick as approximately 10 nm can be provided in some cases. When the gate insulating film is made thick, parasitic capacitance can be reduced and thus the operating speed of a circuit can be improved. In addition, when the gate insulating film is made thick, leakage current through the gate insulating film is reduced, resulting in a reduction in static current consumption.

As described above, the accelerator 20 can retain data owing to the memory circuit 24 that is an OS memory even when supply of a power supply voltage is stopped. Thus, the power gating of the accelerator 20 is possible and power consumption can be reduced greatly.

The memory circuit 24 formed using an OS transistor can be stacked over the arithmetic circuit 23 that can be formed using a Si CMOS. Consequently, the memory circuit 24 can be provided without an increase in the circuit area.

The memory circuit 24 preferably has a circuit structure of a NOSRAM. "NOSRAM (registered trademark)" is an abbreviation for "Nonvolatile Oxide Semiconductor RAM". A NOSRAM is a memory in which its memory cell is a 2-transistor (2T) or 3-transistor (3T) gain cell, and its access transistor is an OS transistor. An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. In particular, the NOSRAM is capable of reading out retained data without destruction (non-destructive reading), and thus is suitable for parallel processing of a product-sum operation of a neural network in which only data reading operation is repeated many times.

The arithmetic processing portion 21 has a function of performing arithmetic processing using a digital value. The digital value is unlikely to be affected by noise. Thus, the accelerator 20 is suitable for performing arithmetic processing that requires a highly accurate arithmetic result. Note that the arithmetic processing portion 21 is preferably formed using a Si CMOS, i.e., a transistor containing silicon in a channel formation region (Si transistor). With this structure, an OS transistor can be stacked.

The driver circuit 15 has a function of making the memory portions 22_1 to 22_N retain the weight data. In addition, the driver circuit 15 has a function of supplying input data to the arithmetic circuits 23_1 to 23_N to execute the product-sum operation of the neural network or the like.

The memory circuit 24 formed using the OS transistor and the arithmetic circuits 23_1 to 23_N are electrically connected to each other through the bit line NBL and the bit line PBL provided to extend in the direction substantially perpendicular to the surface of the substrate provided with the driver circuit 15 and the arithmetic circuits 23_1 to 23_N. Note that "substantially perpendicular" refers to a state where an arrangement angle is greater than or equal to 85° and less than or equal to 95°. Note that in this specification, the X direction, the Y direction, and the Z direction illustrated in FIG. 1B or the like are directions orthogonal to or intersecting with each other. Here, it is preferable that the X direction and the Y direction be parallel or substantially parallel to a substrate surface and the Z direction be perpendicular or substantially perpendicular to the substrate surface.

The arithmetic circuits 23_1 to 23_N have a function of performing any one of an integer arithmetic operation, a single precision floating-point arithmetic operation, a double precision floating-point arithmetic operation, and the like with use of the input data $A_1$ to $A_N$ and the weight data $W_1$ to $W_N$. The arithmetic circuit 23 has a function of repeating the same processing such as a product-sum operation.

Note that the arithmetic circuits 23_1 to 23_N employ such a structure that one arithmetic circuit 23 is provided for every bit line NBL and bit line PBL of the memory circuit 24, i.e., for every one column (Column-Parallel Calculation). With this structure, data of one row (all bit lines at the maximum) of the memory circuit 24 can be subjected to arithmetic processing in parallel. As compared to a product-sum operation using the CPU 10, there is no limitation on the data bus size (e.g., 32 bits) between the CPU and the memory, and thus the parallelism of an arithmetic operation can be greatly increased in Column-Parallel Calculation. Accordingly, an arithmetic efficiency regarding an enormous amount of arithmetic processing such as learning of a deep neural network (deep learning) or a scientific computation that performs a floating-point arithmetic operation, which is the AI technology, can be improved. Additionally, data output from the memory circuit 24 can be read out after completion of the arithmetic operation, whereby power required for memory access (data transfer between a CPU and a memory and an arithmetic operation in a CPU) can be reduced and heat generation and an increase in power consumption can be suppressed. Furthermore, when the physical distance between the arithmetic circuit 23 and the memory circuit 24 is decreased, for example, a wiring distance can be shortened by stacking layers, parasitic capacitance generated in a signal line can be reduced and low power consumption can be achieved.

In the arithmetic circuits 23_1 to 23_N, silicon is used for a semiconductor layer of a transistor included in each circuit. A transistor including silicon in a semiconductor layer is referred to as a Si transistor. The Si transistor is preferably formed using an SOI substrate in which an insulating layer is formed with an oxide buried (Burried oxide) into a silicon substrate (such an insulating layer is also referred to as a BOX layer) and single crystal silicon is provided over the insulating layer. The silicon substrate is, for example, a p-type single-crystal silicon substrate.

A well region in which an impurity element imparting conductivity is added can be provided over the silicon substrate where the Si transistor is provided. The well region can serve as a bottom gate electrode by independently changing the potential of the well region. Accordingly, the threshold voltage of the Si transistor can be controlled. In particular, when a negative potential is applied to the well region, the threshold voltage of the Si transistor can be further increased, and the off-state current can be reduced. Therefore, a negative potential is applied to the well region, so that a drain current when a potential applied to a gate electrode of the Si transistor is 0 V can be reduced. Furthermore, addition of the impurity element to the channel formation region for the purpose of controlling the threshold voltage is not necessary, a variation in threshold voltages can be reduced, and the power supply voltage can be lowered. As a result, power consumption of the arithmetic circuits 23_1 to 23_N can be reduced, and the arithmetic efficiency can be improved.

The bus 30 electrically connects the CPU 10 to the accelerator 20. That is, data can be transferred between the CPU 10 and the accelerator 20 through the bus 30.

Figure 2A:
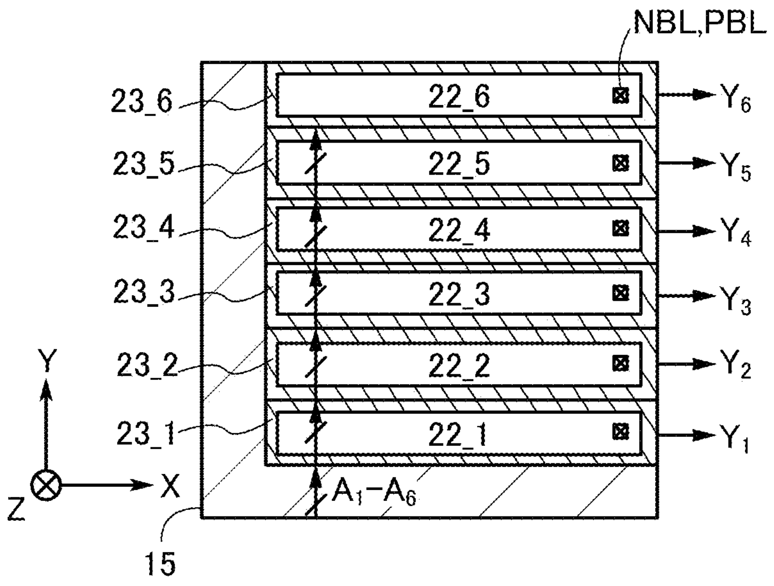
FIG. 2A and FIG. 2B are diagrams each illustrating a structure example of a semiconductor device.

Next, advantages of the structures shown in FIG. 1A and FIG. 1B are described. FIG. 2A is a schematic plan view seen from the z direction of the schematic view in FIG. 1B. FIG. 2A shows that six arithmetic circuits 23_1 to 23_6 are arranged in the y direction and six memory portions 22_1 to 22_6 are arranged to overlap with the arithmetic circuits 23_1 to 23_6 in the z direction. FIG. 2A also shows the driver circuit 15 that supplies input data $A_1$ to $A_6$ to the six arithmetic circuits 23_1 to 23_6 through the data input line $A_{IN}$.

By the arithmetic circuits 23_1 to 23_6 in FIG. 2A, outputs signals $Y_1$ to $Y_6$ corresponding to the product of the data W ($W_1$ to $W_6$) represented by three levels based on data of the pair of bit lines NBL and PBL and the input data A ($A_1$ to $A_6$) from the data input line $A_{IN}$ (=W×A) can be obtained.

In FIG. 2A, the arithmetic circuits 23_1 to 23_6 are respectively connected to the memory portions 22_1 to 22_6 through the bit lines NBL and PBL (illustrated as one opening portion in FIG. 2A). In other words, FIG. 2A shows that the arithmetic circuits and the memory portions are connected through wirings extended in the z direction. Accordingly, the bit lines NBL and PBL enable a reduction in the distance between the arithmetic circuits 23_1 to 23_6 and the memory portions 22_1 to 22_6. Therefore, the parasitic capacitance between the bit lines NBL and PBL and other elements can be reduced. Consequently, electric charge due to charge and discharge of the bit lines can be reduced, which leads to low power consumption and an improvement in arithmetic efficiency.

In addition, in the structure of FIG. 2A, all transistors in the memory portions 22_1 to 22_6 are OS transistors; thus, the memory portions 22_1 to 22_6 can be stacked over the arithmetic circuits 23_1 to 23_6 including Si transistors. In other words, as the arrangement of the arithmetic circuit and the memory portion, they can overlap with each other, which enables inhibition of increment in the circuit area caused by the arrangement of the memory portion. Therefore, the semiconductor device can be downsized. In addition, the data input line $A_{IN}$ extending from the driver circuit 15 can be shortened.

Figure 2B:
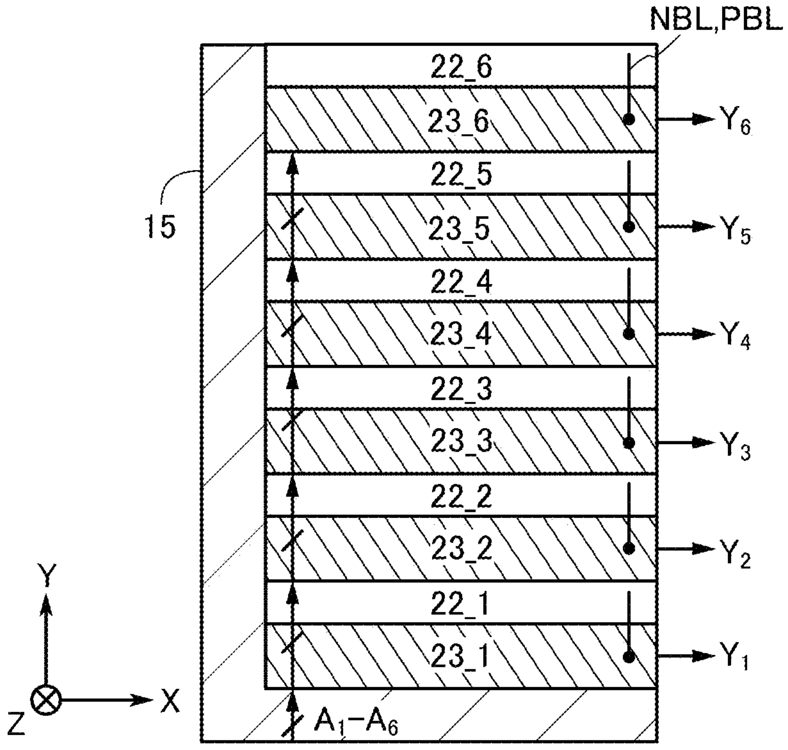

FIG. 2B is a schematic view in the case where the arithmetic circuits 23_1 to 23_6 and the memory portions 22_1 to 22_6 are alternately arranged in the y direction. The illustration in FIG. 2B is in a manner similar to that in FIG. 2A. FIG. 2B shows an example in which the memory circuits are formed using Si transistors so that the data retention circuits of the memory circuits are formed with SRAM (Static RAM). Therefore, unlike the case of FIG. 2A, the arithmetic processing portion and the memory portion are not arranged to overlap with each other but are arranged on the same plane.

In FIG. 2B, the arithmetic circuits 23_1 to 23_6 are respectively connected to the adjacent memory portions 22_1 to 22_6 through the bit lines NBL and PBL (illustrated as one wiring in FIG. 2A) extended from the adjacent memory portions 22_1 to 22_6. In other words, FIG. 2B shows that the arithmetic circuit and the memory portion are connected through the wiring extending in the y direction. Accordingly, the arithmetic circuits 23_1 to 23_6 and the memory portions 22_1 to 22_6 can be arranged in a longer distance with the bit lines NBL and PBL than the case where the wiring extends in the z direction. As a result, the parasitic capacitance between the bit lines NBL and PBL and other elements is increased. Thus, electric charge due to charge/discharge of the bit lines is increased. From the above, it can be said that the structure of one embodiment of the present invention illustrated in FIG. 2A is excellent in reductions in size and power consumption.

As described above, one embodiment of the present invention can provide a downsized semiconductor device including an accelerator and a CPU. Alternatively, one embodiment of the present invention can provide a low power semiconductor device including an accelerator and a CPU. Alternatively, one embodiment of the present invention can reduce the number of times of data transfer of a CPU of a semiconductor device. Alternatively, a semiconductor device with a novel structure can be provided. In other words, the semiconductor device of one embodiment of the present invention has a non-von Neumann architecture and can perform parallel processing with extremely low power consumption as compared with a von Neumann architecture, in which power consumption increases with increasing processing speed.

Figure 3A:
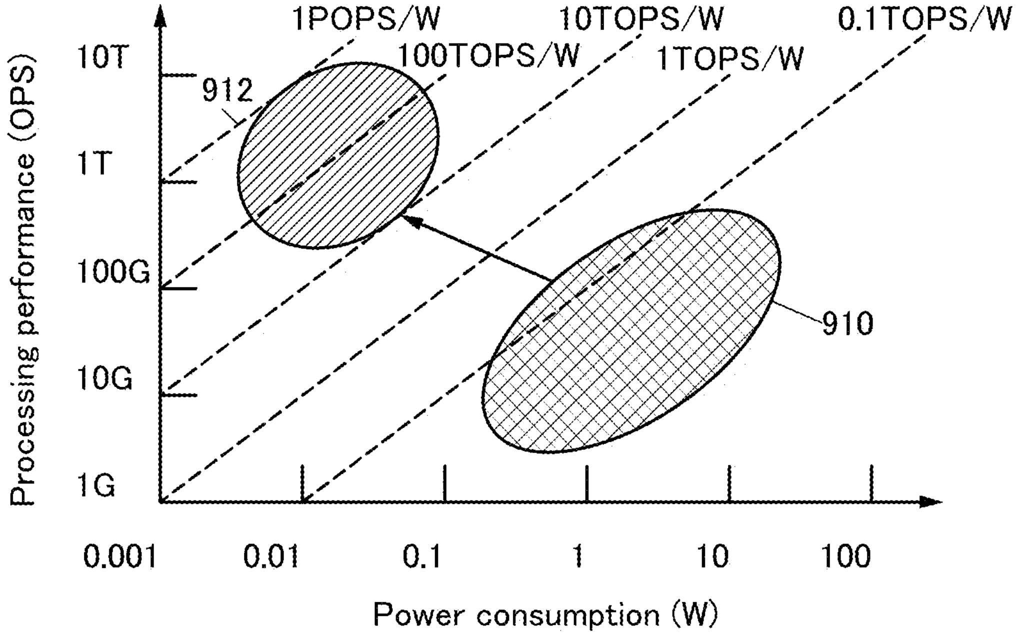
FIG. 3A, FIG. 3B, and FIG. 3C are diagrams describing structure examples of semiconductor devices.

FIG. 3A illustrates the relationship between the processing performance (OPS: Operations Per Second) and the power consumption (W). In FIG. 3A, the vertical axis represents processing performance and the horizontal axis represents power consumption. Furthermore, in FIG. 3A, as indicators of the arithmetic efficiency, dashed lines indicating 0.1 TOPS/W (Tera Operations Per Second/W), 1 TOPS/W, 10 TOPS/W, 100 TOPS/W, and 1 POPS/W (Pera Operations Per Second/W) are shown.

In FIG. 3A, a region 910 is a region including a conventional general-purpose AI accelerator (Neumann type) and a region 912 is a region including the semiconductor device of one embodiment of the present invention. Note that a CPU (Central Processing Unit), a GPU (Graphics Processing Unit), a GPU (Graphics Processing Unit), an FPGA (Field-Programmable Gate Array), and the like are included in the region 910, for example.

As shown in FIG. 3A, the power consumption of the semiconductor device of one embodiment of the present invention can be lower than that of the conventional general-purpose AI accelerator (Neumann type) by approximately two digits, and the processing performance can be increased greatly (e.g., 1000 times or more). Note that an arithmetic efficiency of 100 TOPS/W or more can be expected with use of the semiconductor device of one embodiment of the present invention.

Figure 3B:
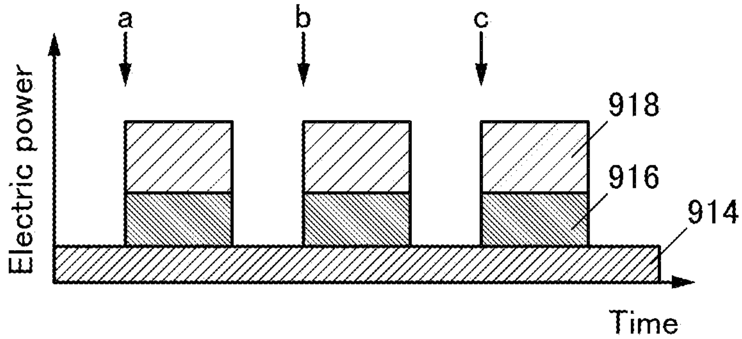

Here, specific examples of a conventional structure and a structure to which the semiconductor device of one embodiment of the present invention is applied are described with reference to FIG. 3B and FIG. 3C. FIG. 3B is an image diagram of power consumption of a semiconductor device having a conventional structure in image recognition, and FIG. 3C is an image diagram of power consumption of the semiconductor device having the structure of one embodiment of the present invention in image recognition.

Figure 3C:
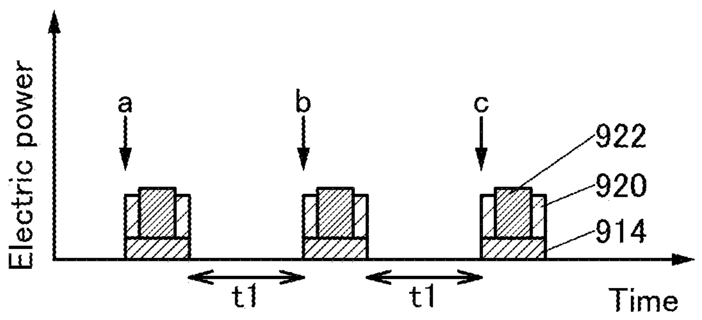

In each of FIG. 3B and FIG. 3C, the vertical axis represents electric power and the horizontal axis represents time. In FIG. 3B, electric power 914 indicates leakage electric power, electric power 916 indicates CPU electric power (power consumed by the CPU), and electric power 918 indicates memory electric power. In FIG. 3C, the electric power 914 indicates leakage electric power, electric power 920 indicates CPU electric power, and electric power 922 indicates accelerator electric power (power consumed by the accelerator). Note that the electric power 922 includes electric power used by the arithmetic circuit and the memory circuit.

In each of FIG. 3B and FIG. 3C, an arrow a, an arrow b, and an arrow c indicate signals in image recognition. Note that it is assumed that input of the signals indicated by the arrow a, the arrow b, and the arrow c starts arithmetic processing such as image recognition in the semiconductor devices.

As shown in FIG. 3B, a certain amount of leakage electric power (the electric power 914) is generated with respect to time in the semiconductor device having the conventional structure. In contrast, as shown in FIG. 3C, in the case where the semiconductor device of one embodiment of the present invention is employed, leakage electric power (the electric power 914) is generated while CPU electric power (the electric power 920) and accelerator electric power (the electric power 922) are used, but normally-off drive without generation of leakage electric power (the electric power 914) is possible in a period where CPU electric power (the electric power 920) and accelerator electric power (the electric power 922) are not used (in a period t1 shown in FIG. 3C). Thus, power consumption can be greatly reduced. That is, an ultralow power semiconductor device can be provided.

Figure 4:
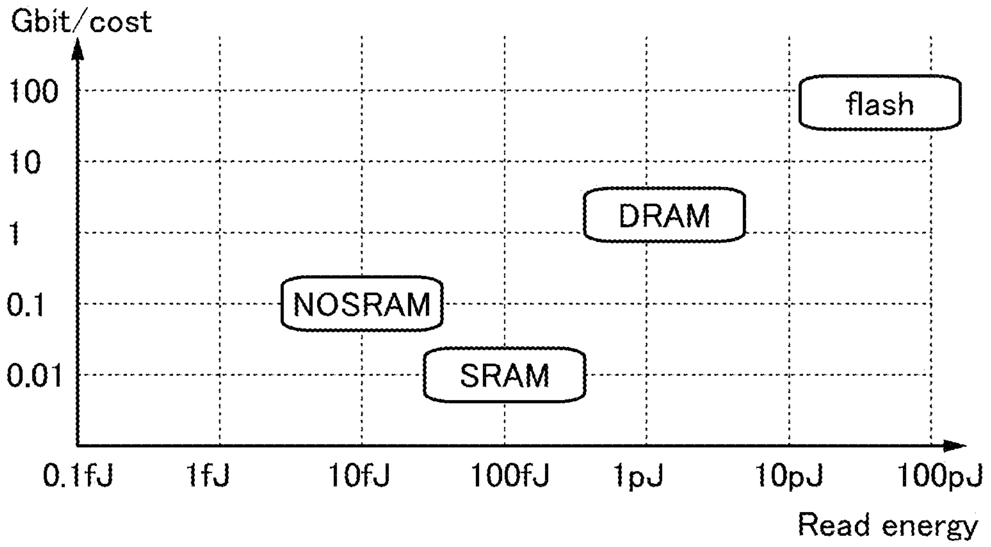
FIG. 4 is a diagram describing structure examples of semiconductor devices.

FIG. 4 is a graph showing the relative cost per 1 Gbit (1 Gbit/cost) with respect to the read energy, for comparing NOSRAM included in the semiconductor device of one embodiment of the present invention described with FIG. 3A with DRAM (Dynamic RAM), SRAM (Static RAM), and flash memory (flash) which are included in CPU (Central Processing Unit), GPU (Graphics Processing Unit), FPGA (Field-Programmable Gate Array), and the like.

Flash memory is excellent in the relative cost per 1 Gbit whereas having a high read energy, 100 pJ. DRAM is inferior in the relative cost per 1 Gbit to flash memory whereas having a small read energy. SRAM is significantly inferior in the relative cost per 1 Gbit to DRAM and flash memory whereas having a significantly small read energy. NOSRAM included in the semiconductor device of one embodiment of the present invention has an extremely smaller read energy than flash memory, DRAM, and SRAM, and is more excellent in the relative cost per 1 Gbit than SRAM. Thus, the semiconductor device including NOSRAM is suitable for aiming at the arithmetic efficiency over 100 TOPS/W as described with FIG. 3A.

Figure 5A:
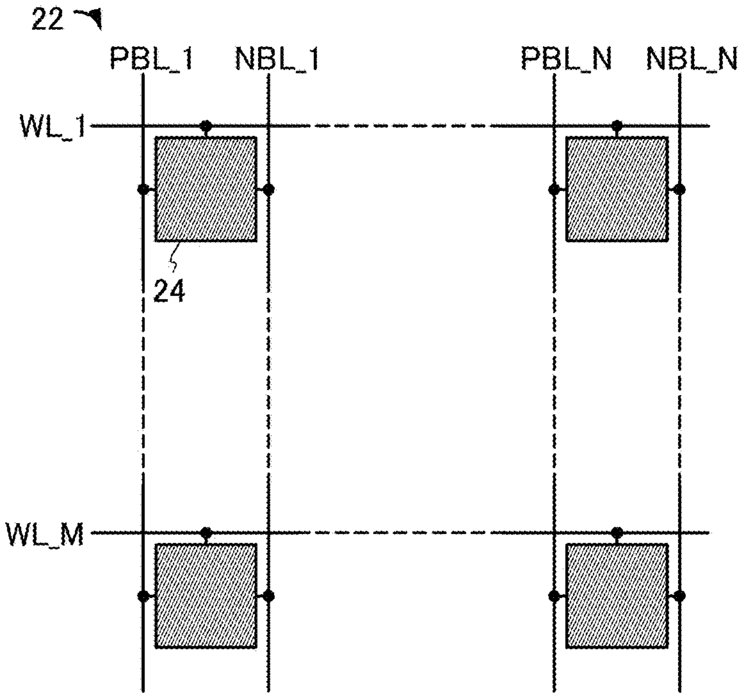
FIG. 5A, FIG. 5B, and FIG. 5C are diagrams illustrating a structure example of a semiconductor device.

FIG. 5A is a diagram illustrating a circuit structure example applicable to the memory portions 22_1 to 22_N included in the semiconductor device 100 of the present invention. FIG. 5A illustrates bit lines PBL_1 to PBL_N, bit lines NBL_1 to NBL_N, and word lines WL_1 to WL_M (M is a natural number) arranged in a matrix of M rows and N columns (M and N are each a natural number greater than or equal to 2). The memory circuits 24 connected to the word lines and the bit lines are also illustrated.

Figure 5B:
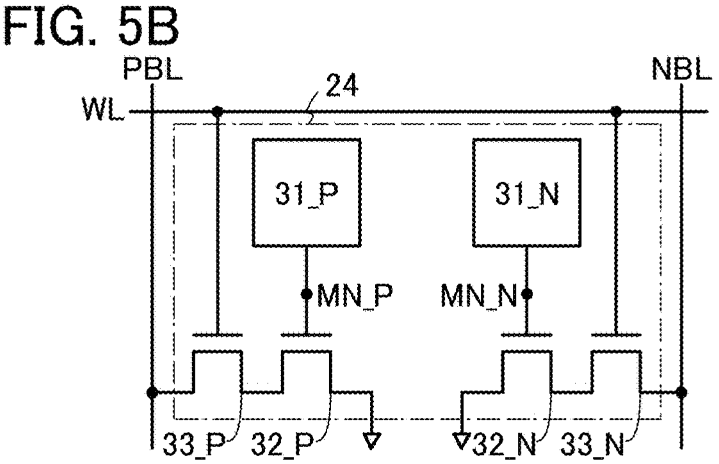

FIG. 5B is a diagram illustrating a circuit structure example applicable to the memory circuit 24. The memory circuit 24 includes a data retention circuit 31_P, a data retention circuit 31_N, a transistor 32_P, a transistor 32_N, a transistor 33_P, and a transistor 33_N.

Each of the transistors in the memory circuit 24 may include a back gate. In this case, the back gate may be connected to a gate or may be supplied with a potential different from that of the gate to control electrical characteristics of the transistor.

The data retention circuit 31_P is connected to a node MN_P of a wiring connected to a gate of the transistor 32_P. One of a source and a drain of the transistor 32_P is electrically connected to a fixed potential such as GND. One of a source and a drain of the transistor 33_P is connected to the other of the source and the drain of the transistor 32_P. One of a source and a drain of the transistor 33_P is connected to the bit line PBL. A gate of the transistor 33_P is connected to the word line WL.

The data retention circuit 31_N is connected to a node MN_N of a wiring connected to a gate of the transistor 32_N. One of a source and a drain of the transistor 32_N is electrically connected to a fixed potential such as GND. One of a source and a drain of the transistor 33_N is connected to the other of the source and the drain of the transistor 32_N. One of a source and a drain of the transistor 33_N is connected to the bit line NBL. A gate of the transistor 33_N is connected to the word line WL.

Figure 5C:
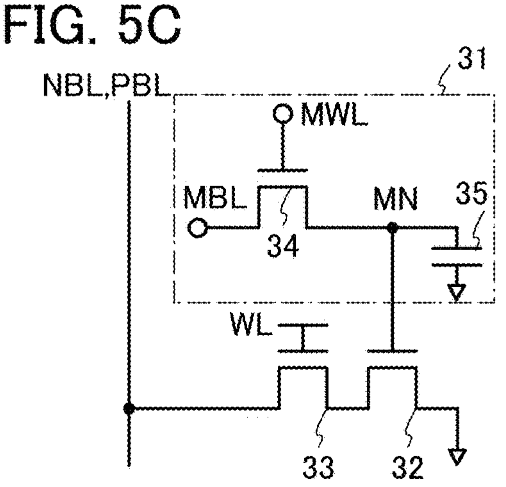

The data retention circuit 31_P and the data retention circuit 31_N each have a function of holding a signal corresponding to a voltage at H level or L level. FIG. 5C shows a circuit structure of a data retention circuit 31 applicable to the data retention circuit 31_P and the data retention circuit 31_N in FIG. 5B.

A combination of the data retention circuit 31 with a transistor 32 applicable to the transistors 32_P and 32_N and a transistor 33 applicable to the transistors 33_P and 33_N corresponds to NOSRAM of a 3-transistor (3T) gain cell. The data retention circuit 31 includes a transistor 34 and a capacitor 35 as illustrated in FIG. 5C. The transistor illustrated in FIG. 5C is an OS transistor. An OS transistor has an extremely low current that flows between a source and a drain in an off state, that is, leakage current. The NOSRAM can be used as a nonvolatile memory by retaining electric charge corresponding to data at the node MN in the memory circuit 24, using characteristics of an extremely low leakage current. The voltage of the node MN is a voltage held by the data retention circuit 31. Note that the voltage held by the data retention circuit 31 is supplied as a signal MBL. The signal MBL can be written to the node MN at the timing of controlling a signal MWL supplied to the gate of the transistor 34. The NOSRAM of a 3-transistor (3T) gain cell can hold voltage whose level is binary or more, e.g., 5 levels or 7 levels.

Figure 6A:
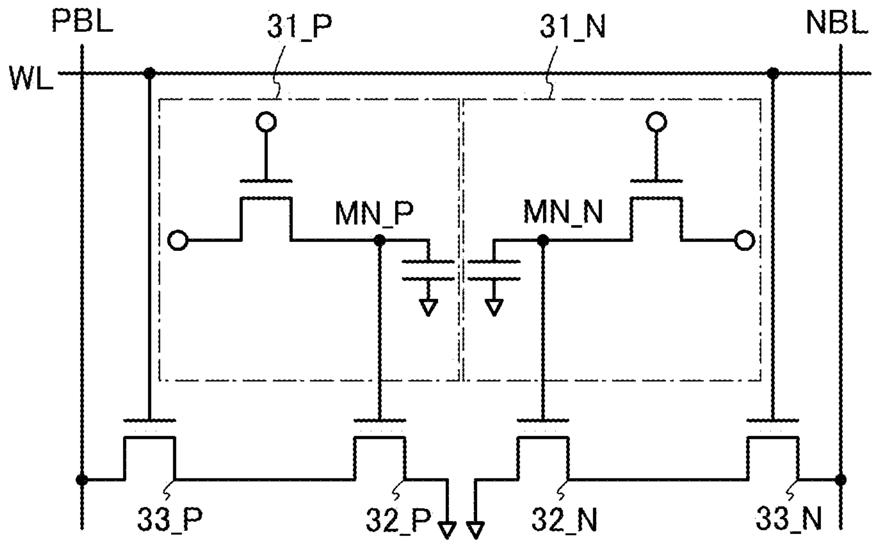
FIG. 6A and FIG. 6B are diagrams each illustrating a structure example of a semiconductor device.

FIG. 6A illustrates a circuit structure in which the structure of the data retention circuit 31 in FIG. 5C is employed for the memory circuit 24 illustrated in FIG. 5B. Table 1 is a truth table of signals shown in FIG. 6A. In Table 1, an H-level voltage and an L-level voltage are expressed as logics “1” and “0”. “Cell P” indicates logic corresponding to the voltage held at the node MN_P, that is, by the data retention circuit 31_P. “Cell N” indicates logic corresponding to the voltage held at the node MN_N, that is, by the data retention circuit 31_N. “W” is data determined by logics of the bit lines NBL and PBL, which is ternary data expressed as “0”, “+1”, or “−1” used in TNN. The prohibition is expressed as “x”.

TABLE 1

| PBL | NBL | Cell P | Cell N | W |
|---|---|---|---|---|
| 0 | 0 | 1 | 1 | X |
| 0 | 1 | 1 | 0 | −1 |
| 1 | 0 | 0 | 1 | +1 |
| 1 | 1 | 0 | 0 | 0 |

Figure 6B:
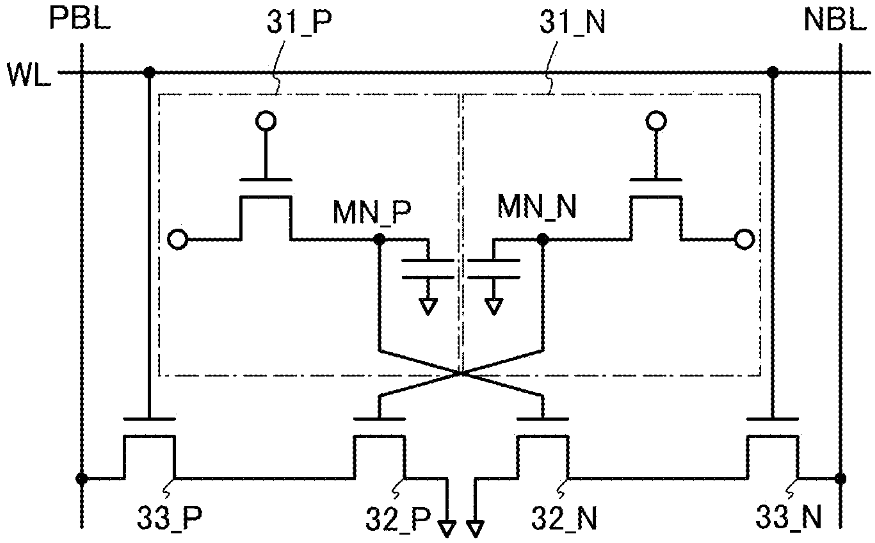

In the structure of FIG. 6A, when the node MN_P holds the H-level voltage and the fixed potential of one of the source and the drain connected to the node MN_N is the ground potential (L-level voltage), the L-level voltage is read out by the bit line PBL. The read voltage is an inverted voltage of the held voltage. Therefore, as illustrated in FIG. 6B, a preferable structure is such that the node MN_P and the gate of the transistor 32_N are connected and the node MN_N and the gate of the transistor 32_P are connected. Table 2 is a truth table of signals shown in FIG. 6B.

TABLE 2

| PBL | NBL | Cell P | Cell N | W |
|---|---|---|---|---|
| 0 | 0 | 1 | 1 | X |
| 0 | 1 | 0 | 1 | −1 |
| 1 | 0 | 1 | 0 | +1 |
| 1 | 1 | 0 | 0 | 0 |

Figure 7A:
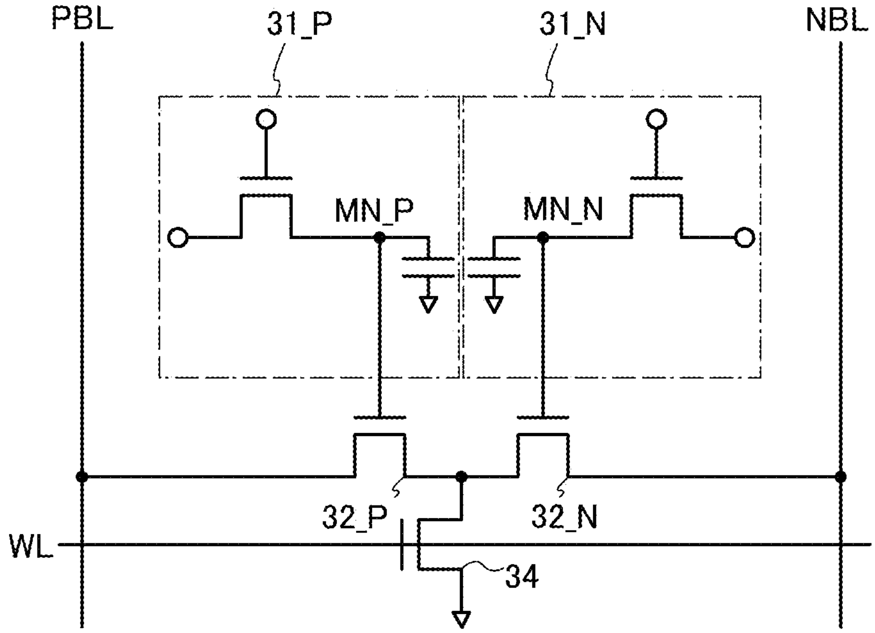
FIG. 7A and FIG. 7B are diagrams each illustrating a structure example of a semiconductor device.

Note that the circuit structure in FIG. 6A can be modified into that in FIG. 7A. As illustrated, FIG. 7A corresponds to a structure in which the transistors 33_P and 33_N are replaced with the transistor 34 and the connection between wirings and the transistors is changed. Data shown in the truth table of Table 1 can be obtained with the circuit structure in FIG. 7A.

Figure 7B:
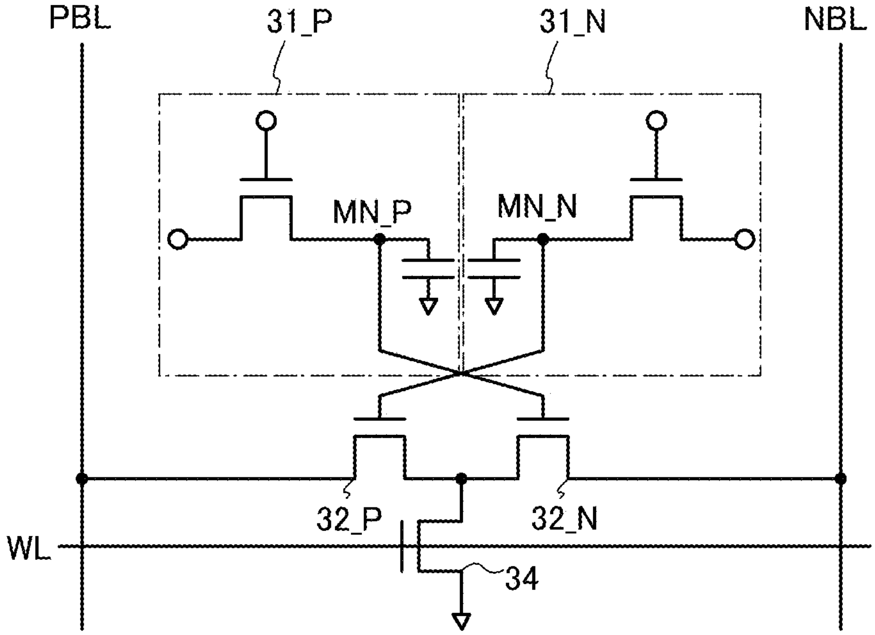

Similarly, the circuit structure in FIG. 6B can be modified into that in FIG. 7B. As illustrated, FIG. 7B corresponds to a structure in which the transistors 33_P and 33_N are replaced with the transistor 34 and the connection between wirings and the transistors is changed. Data shown in the truth table of Table 2 can be obtained with the circuit structure in FIG. 7B.

Figure 8A:
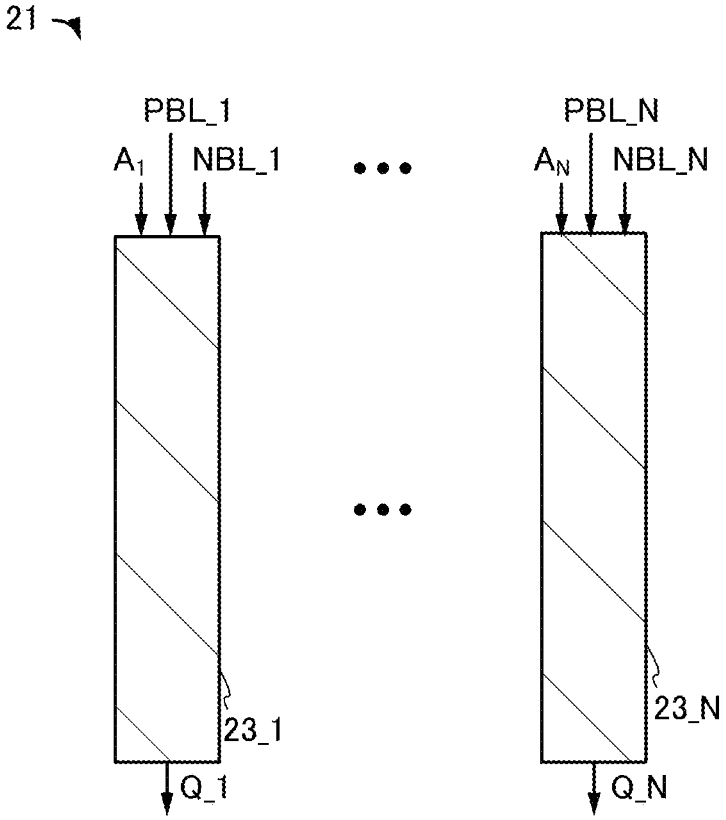
FIG. 8A and FIG. 8B are a diagram each illustrating a structure example of a semiconductor device.

FIG. 8A is a diagram illustrating a circuit structure example applicable to the arithmetic processing portion 21 included in the semiconductor device 100 of the present invention. The arithmetic processing portion 21 includes the arithmetic circuits 23_1 to 23_N. The arithmetic circuits 23_1 to 23_N are supplied with signals from the respective bit line PBL_1 to the bit line PBL_N, the respective bit line NBL_1 to the bit line NBL_N, and the input data $A_1$ to $A_N$ supplied from the data input line $A_{IN}$, and yield output signals Q_1 to Q_N. The output signals Q_1 to Q_N correspond to data obtained by the product-sum operation of the data stored in the memory circuit 24 and the data input from the driver circuit 15 through the data input line $A_{IN}$.

Figure 8B:
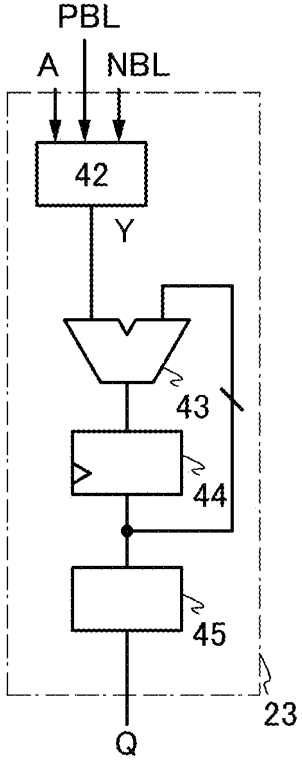

FIG. 8B is a diagram illustrating a circuit structure example of the arithmetic circuit 23 applicable to the arithmetic circuit 23_1 to the arithmetic circuit 23_N. FIG. 8B illustrates a circuit for executing arithmetic processing based on the TNN architecture. The arithmetic circuit 23 includes a logic circuit 42 for performing product-sum operation, an accumulator 43, a latch circuit 44, and an encoding circuit 45 which outputs the output signal Q. To the logic circuit 42, signals from any one of the bit line PBL_1 to the bit line PBL_N (illustrated as data PBL in the drawing), any one of the bit line NBL_1 to the bit line NBL_N (illustrated as data NBL in the drawing), and any one of the input data $A_1$ to $A_N$ (illustrated as data A in the drawing) supplied to the data input line $A_{IN}$ are input. The logic circuit 42 outputs data Y corresponding to the product of data (data W) expressed as ternary data of "0", "+1", or "−1" from the data PBL and the data NBL and data A expressed as binary data of "+1", or "−1" (=W×A).

Table 3 is a truth table of signals shown in the logic circuit in FIG. 8A. Note that in Table 3, "+1" and "−1" of the data A are expressed as 1-bit digital signals of "(0)" and "(1)", respectively. Furthermore, in Table 3, "0", "+1", and "−1" of the data Y are expressed as 2-bit digital signals of "(00)", "(01)", and "(11)", respectively. The prohibition is expressed as "x".

TABLE 3

| PBL | NBL | W | A | Y = W × A |
|---|---|---|---|---|
| 1 | 1 | 0 | −1 (0) | 0 (00) |
| 1 | 0 | +1 | −1 (0) | −1 (11) |
| 0 | 1 | −1 | −1 (0) | +1 (01) |
| 0 | 0 | X | −1 (0) | X |
| 1 | 1 | 0 | +1 (1) | 0 (00) |
| 1 | 0 | +1 | +1 (1) | +1 (01) |
| 0 | 1 | −1 | +1 (1) | −1 (11) |
| 0 | 0 | X | +1 (1) | X |

In FIG. 8A and FIG. 8B, one row is selected in one clock in memory access, so that calculation of addition of M products (=1 bit×M rows) is executed in M clocks. In the arithmetic circuit in FIG. 8A and FIG. 8B, the same calculation of addition of M products can be executed by N parallel operations×1 bit×M/N rows, and thus MIN clocks are needed. Accordingly, in the structures in FIG. 8A and FIG. 8B, arithmetic operation time can be shortened by executing a product-sum operation in parallel, whereby arithmetic efficiency can be improved.

Figure 9A:
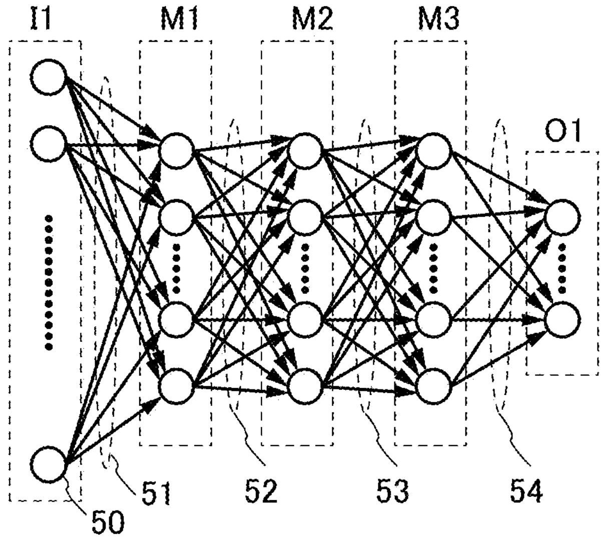
FIG. 9A and FIG. 9B are diagrams each illustrating a structure example of a semiconductor device.

FIG. 9A illustrates a hierarchical neural network. FIG. 9A illustrates a fully connected neural network including neurons 50, one input layer (I1), three intermediate layers (M1 to M3), and one output layer (O1). Given that the number of neurons in the input layer I1 is 786, the number of neurons in each of the intermediate layers M1 to M3 is 256, and the number of neurons in the output layer O1 is 10, the number of connections in layers (a layer 51, a layer 52, a layer 53, and a layer 54) is (786×256)+(256×256)+(256×256)+(256×10), i.e., 334336 in total. That is, the weight parameter required for the neural network calculation is approximately 330 K bits in total, whereby the memory capacity is adequate for a small system.

Figure 9B:
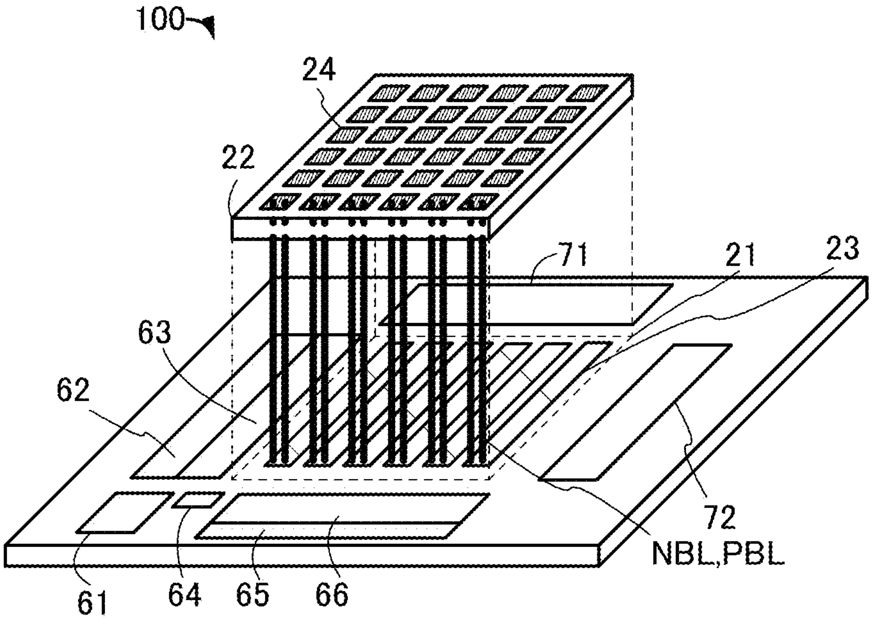

Next, FIG. 9B is a detailed block diagram of the semiconductor device 100 capable of the arithmetic operation of the neural network illustrated in FIG. 9A.

FIG. 9B illustrates an example of structures of the arithmetic processing portion 21, the arithmetic circuit 23 corresponding to the arithmetic circuits 23_1 to 23_N, the memory portion 22 corresponding to the memory portions 22_1 to 22_N, the memory circuits 24, and the bit lines NBL and PBL, which are described with FIG. 1A and FIG. 1B, and the driver circuit 15 illustrated in FIG. 1A and FIG. 1B.

FIG. 9B illustrates, as components of the driver circuit 15 described with FIG. 1A and FIG. 1B, a controller 61, a row decoder 62, a word line driver 63, a column decoder 64, a write driver 65, a precharge circuit 66, an input buffer 71, and an arithmetic control circuit 72.

Figure 10A:
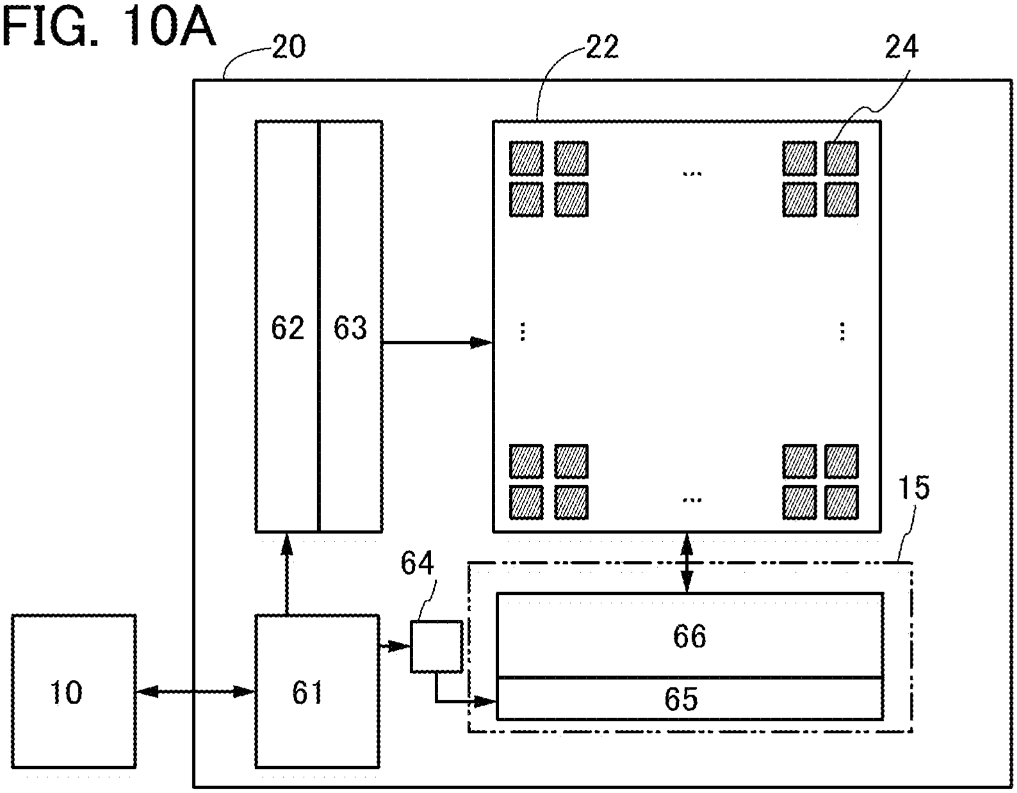
FIG. 10A and FIG. 10B are diagrams each illustrating a structure example of a semiconductor device.

FIG. 10A is a diagram of blocks for controlling the memory portion 22, which are extracted from the structure illustrated in FIG. 9B. FIG. 10A illustrates the controller 61, the row decoder 62, the word line driver 63, the column decoder 64, the write driver 65, and the precharge circuit 66.

The controller 61 processes an input signal from the outside and generates control signals of the row decoder 62 and the column decoder 64. The input signal from the outside is a control signal for controlling the memory portion 22, such as a write enable signal or a read enable signal. The controller 61 performs input and output of data written to the memory portion 22 or data read out from the memory portion 22 between the CPU 10 and the memory portion 22 through the bus.

The row decoder 62 generates a signal for driving the word line driver 63. The word line driver 63 generates a signal supplied to the word line WL as well as the signal MWL supplied to the data retention circuits 31_P and the 31_N. The column decoder 64 generates signals for driving the write driver 65. The write driver 65 generates input data $A_1$ to $A_N$ supplied to the data input line $A_{IN}$ as well as the signal MBL supplied to the data retention circuits 31_P and 31_N. The precharge circuit 66 has a function of precharging the bit lines NBL and PBL or the like. The signal read out from the memory circuit 24 in the memory portion 22 is input to the arithmetic circuit 23 through the bit lines NBL and PBL.

Figure 10B:
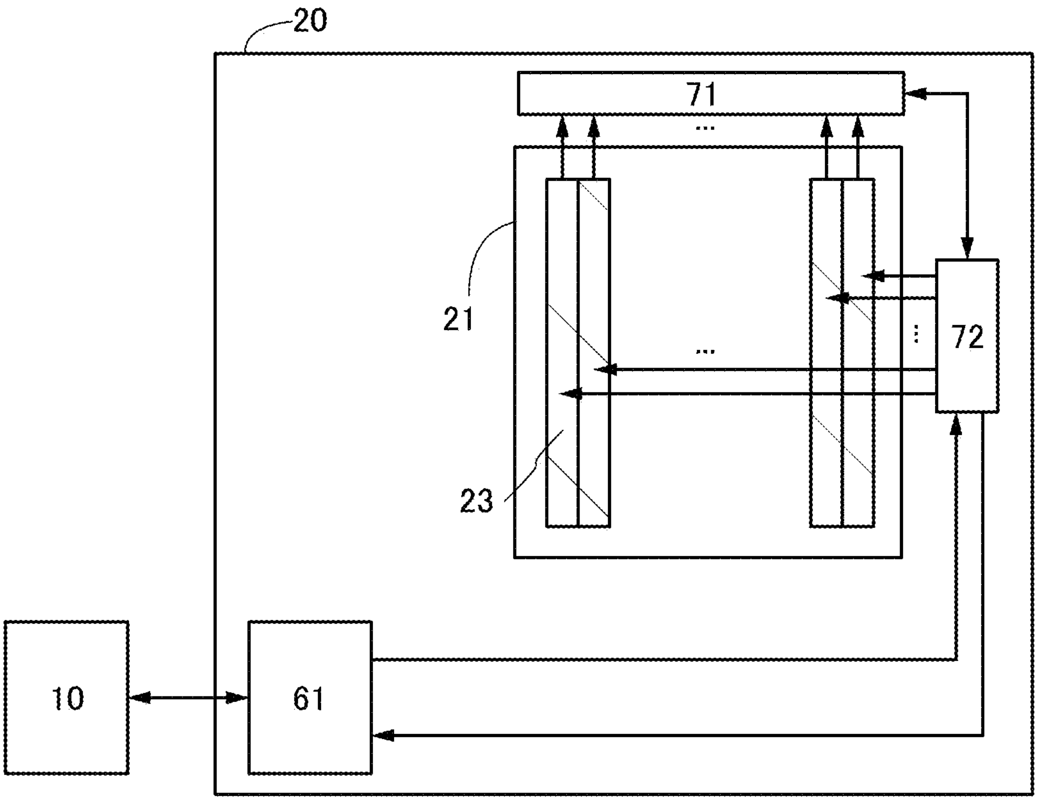

FIG. 10B is a diagram of blocks for controlling the arithmetic processing portion 21, which are extracted from the structure illustrated in FIG. 9B.

The controller 61 processes an input signal from the outside and generates a control signal of the arithmetic control circuit 72. The controller 61 generates a variety of signals, such as a clock signal, for controlling the arithmetic circuit 23 included in the arithmetic processing portion 21. The arithmetic control circuit 72 generates input data $A_1$ to $A_N$ supplied to the data input line $A_{IN}$ in accordance with a control by the controller 61 and an output from the buffer 71. The arithmetic processing portion 21 inputs data on arithmetic operation results into the arithmetic processing portion 21 again through the input buffer 71 and the arithmetic control circuit 72. When the arithmetic processing portion 21 processes data on the arithmetic operation results with use of a buffer memory in the input buffer 71, parallel operation with the number of bits greater than or equal to the data bus width of the CPU can be achieved without reading data that is under arithmetic operation to a main memory or the like outside the accelerator. Furthermore, the number of times of transferring an enormous number of weight parameters to/from the CPU 10 can be reduced, whereby power consumption can be reduced.

As described above, one embodiment of the present invention can provide a downsized semiconductor device including an accelerator and a CPU. Alternatively, one embodiment of the present invention can provide a low power semiconductor device including an accelerator and a CPU. Alternatively, one embodiment of the present invention can reduce the number of times of data transfer in a CPU of a semiconductor device. Alternatively, a semiconductor device with a novel structure can be provided.

Embodiment 2

In this embodiment, an example of an operation of the case where the accelerator 20 executes part of an arithmetic operation of a program executed by the CPU 10 described in the above embodiment is described.

Figure 11:
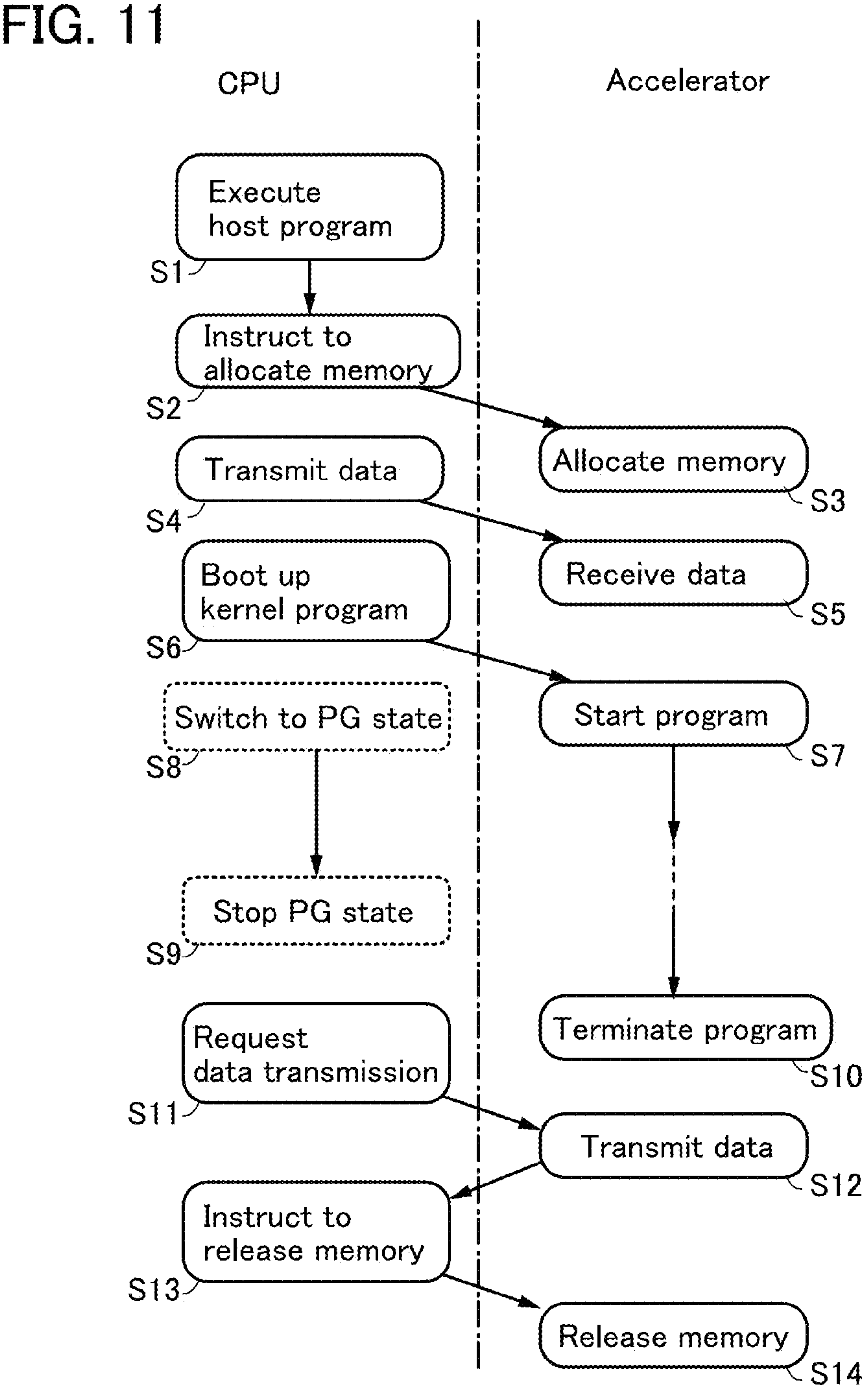
FIG. 11 is a diagram showing a structure example of a semiconductor device.

FIG. 11 illustrates an example of an operation of the case where the accelerator executes part of an arithmetic operation of a program executed by the CPU.

The host program is executed by the CPU (Step S1).

In the case where the CPU confirms an instruction to allocate, to a memory portion, a region for data needed in performing an arithmetic operation using the accelerator (Step S2), the CPU allocates the region for the data to the memory portion (Step S3).

Next, the CPU transmits input data from the main memory to the above-described memory portion (Step S4). The above-described memory portion receives the input data and stores the input data in the region allocated in Step S2 (Step S5).

In the case where the CPU confirms an instruction to boot up the kernel program (Step S6), the accelerator starts execution of the kernel program (Step S7).

Immediately after the accelerator starts the execution of the kernel program, the CPU may be switched from the state of performing an arithmetic operation to a PG state (Step S8). In that case, just before the accelerator terminates the execution of the kernel program, the CPU is switched from the PG state to a state of performing an arithmetic operation (Step S9). By bringing the CPU into a PG state during the period from Step S8 to Step S9, the power consumption and heat generation of the semiconductor device as a whole can be suppressed.

When the accelerator terminates the execution of the kernel program, output data is stored in the above-described memory portion (Step S10).

After the execution of the kernel program is terminated, in the case where the CPU confirms an instruction to transmit the output data stored in the memory portion to the main memory (Step S11), the above-described output data is transmitted to the above-described main memory and stored in the above-described main memory (Step S12).

In the case where the CPU confirms an instruction to release the region for the data allocated to the memory portion (Step S13), the region allocated to the above-described memory portion is released (Step S14).

By repeating the operations from Step S1 to Step S14 described above, part of the arithmetic operation of the program executed by the CPU can be executed by the accelerator while the power consumption and heat generation of the CPU and the accelerator are suppressed.

This embodiment can be combined with the description of the other embodiments as appropriate.

Embodiment 3

In this embodiment, an example of a CPU including a CPU core capable of power gating will be described.

Figure 12:
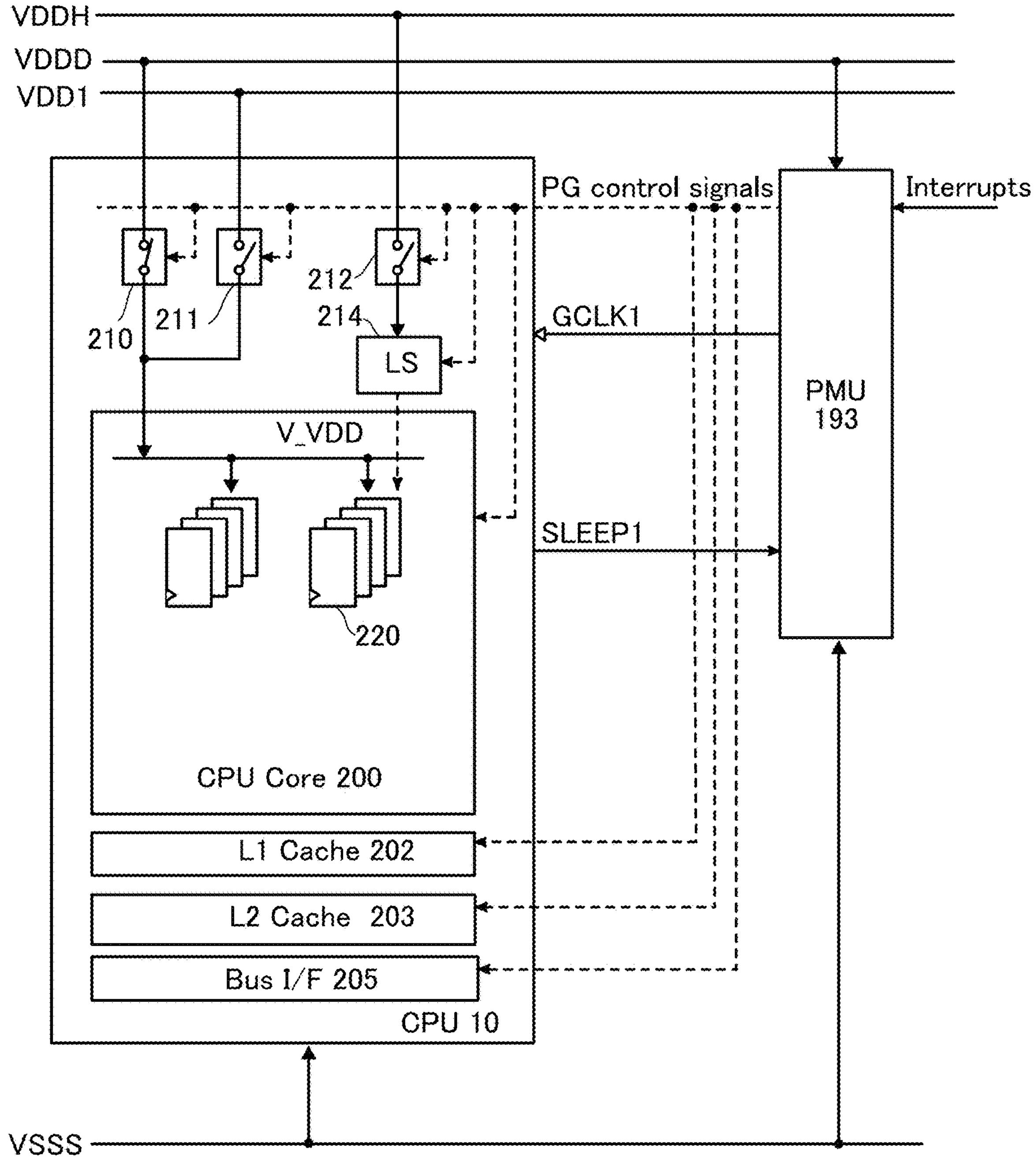
FIG. 12 is a diagram illustrating a structure example of a CPU.

FIG. 12 illustrates a structure example of the CPU 10. The CPU 10 includes a CPU core (CPU Core) 200, an L1 (level 1) cache memory device (L1 Cache) 202, an L2 cache memory device (L2 Cache) 203, a bus interface portion (Bus I/F) 205, power switches 210 to 212, and a level shifter (LS) 214. The CPU core 200 includes a flip-flop 220.

Through the bus interface portion 205, the CPU core 200, the L1 cache memory device 202, and the L2 cache memory device 203 are mutually connected to one another.

A PMU 193 generates a clock signal GCLK1 and various PG (power gating) control signals in response to signals such as an interrupt signal (Interrupts) input from the outside and a signal SLEEP1 issued from the CPU 10. The clock signal GCLK1 and the PG control signal are input to the CPU 10. The PG control signal controls the power switches 210 to 212 and the flip-flop 220.

The power switches 210 and 211 control application of voltages VDDD and VDD1 to a virtual power supply line V_VDD (hereinafter referred to as a V_VDD line), respectively. The power switch 212 controls application of a voltage VDDH to a virtual power supply line V_VDH (hereinafter referred to as a V_VDH line). A voltage VSS is input to the CPU 10 and the PMU 193 without through the power switches. The voltage VDDD is input to the PMU 193 without through the power switches.

The voltages VDDD and VDD1 are drive voltages for a CMOS circuit. The voltage VDD1 is lower than the voltage VDDD and is a drive voltage in a sleep state. The voltage VDDH is a drive voltage for an OS transistor and is higher than the voltage VDDD.

The L1 cache memory device 202, the L2 cache memory device 203, and the bus interface portion 205 each include at least a power domain capable of power gating. The power domain capable of power gating is provided with one or a plurality of power switches. These power switches are controlled by the PG control signal.

The flip-flop 220 is used for a register. The flip-flop 220 is provided with a backup circuit. The flip-flop 220 is described below.

Figure 13A:
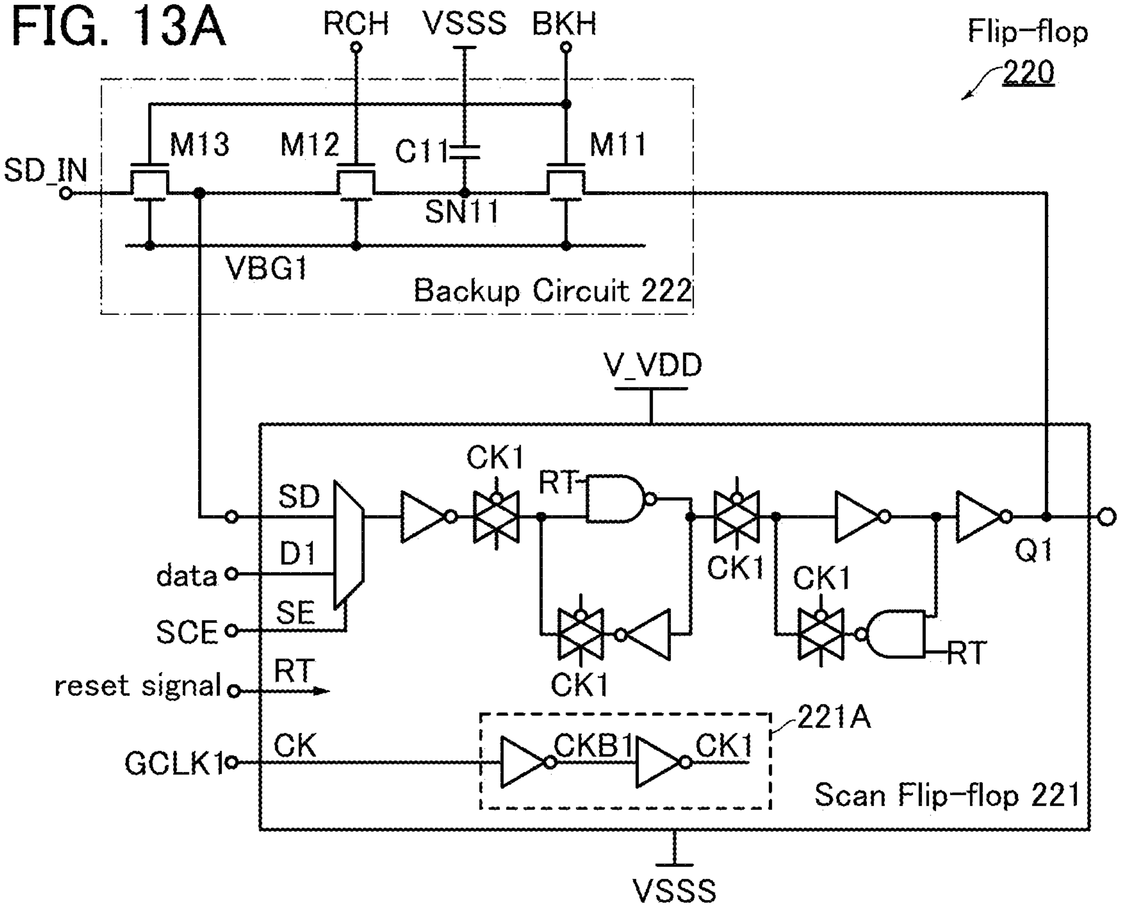
FIG. 13A and FIG. 13B are diagrams each illustrating a structure example of a CPU.

FIG. 13A shows a circuit structure example of the flip-flop 220. The flip-flop 220 includes a scan flip-flop 221 and a backup circuit 222.

The scan flip-flop 221 includes nodes D1, Q1, SD, SE, RT, and CK and a clock buffer circuit 221A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 221A. Respective analog switches in the scan flip-flop 221 are connected to nodes CK1 and CKB1 of the clock buffer circuit 221A. The node RT is a reset signal input node.

The signal SCE is a scan enable signal, which is generated in the PMU 193. The PMU 193 generates signals BK and RC. The level shifter 214 level-shifts the signals BK and RC to generate signals BKH and RCH. The signals BK and RC are a backup signal and a recovery signal.

The circuit structure of the scan flip-flop 221 is not limited to that in FIG. 13. A scan flip-flop prepared in a standard circuit library can be applied.

The backup circuit 222 includes nodes SD_IN and SN11, transistors M11 to M13, and a capacitor C11.

The node SD_IN is a scan test data input node and is connected to the node Q1 of the scan flip-flop 221. The node SN11 is a retention node of the backup circuit 222. The capacitor C11 is a storage capacitor for retaining the voltage of the node SN11.

The transistor M11 controls continuity between the node Q1 and the node SN11. The transistor M12 controls continuity between the node SN11 and the node SD. The transistor M13 controls continuity between the node SD_IN and the node SD. The on/off of the transistors M11 and M13 is controlled by the signal BKH, and the on/off of the transistor M12 is controlled by the signal RCH.

The transistors M11 to M13 are OS transistors, like the transistors included in the data retention circuit 31_N and 31_P and the transistors 32_P, 32_N, 33_P, and 33_N. The transistors M11 to M13 have back gates in the illustrated structure. The back gates of the transistors M11 to M13 are connected to a power supply line for supplying a voltage VBG1.

At least the transistors M11 and M12 are preferably OS transistors. Because of an extremely low off-state current, which is a feature of the OS transistor, a decrease in the voltage of the node SN11 can be suppressed and almost no power is consumed to retain data; therefore, the backup circuit 222 has a nonvolatile characteristic. Data is rewritten by charging and discharging of the capacitor C11; hence, there is theoretically no limitation on rewrite cycles of the backup circuit 222, and data can be written and read out with low energy.

Figure 13B:
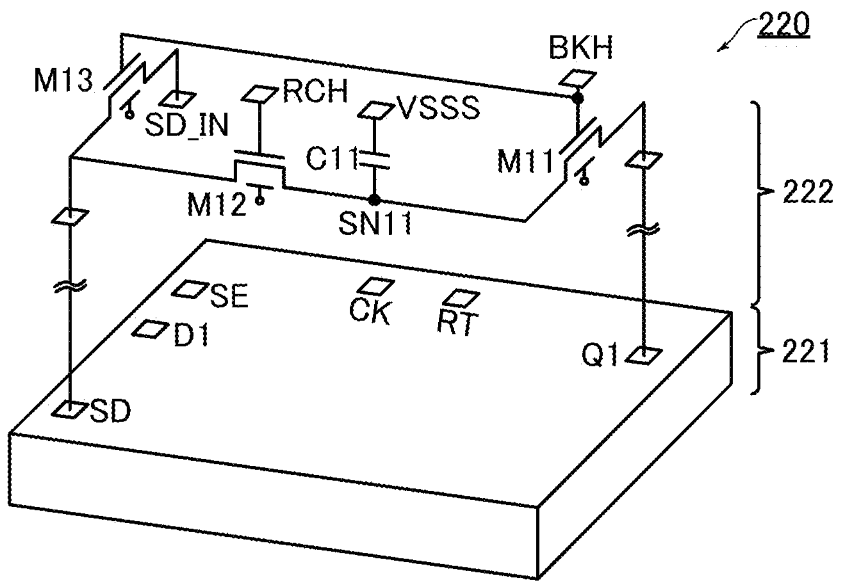

All of the transistors in the backup circuit 222 are extremely preferably OS transistors. As illustrated in FIG. 13B, the backup circuit 222 can be stacked on the scan flip-flop 221 configured with a silicon CMOS circuit.

The number of elements in the backup circuit 222 is much smaller than the number of elements in the scan flip-flop 221; thus, there is no need to change the circuit structure and layout of the scan flip-flop 221 in order to stack the backup circuit 222. That is, the backup circuit 222 is a backup circuit that has very broad utility. In addition, the backup circuit 222 can be provided in a region where the scan flip-flop 221 is formed; thus, even when the backup circuit 222 is incorporated, the area overhead of the flip-flop 220 can be zero. Thus, the backup circuit 222 is provided in the flip-flop 220, whereby power gating of the CPU core 200 is enabled. The power gating of the CPU core 200 is enabled with high efficiency owing to little energy necessary for the power gating.

When the backup circuit 222 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 221. That is, even when the backup circuit 222 is provided, the performance of the flip-flop 220 does not substantially decrease.

The CPU core 200 can be set to a clock gating state, a power gating state, or a resting state as a low power consumption state. The PMU 193 selects the low power consumption mode of the CPU core 200 on the basis of the interrupt signal, the signal SLEEP1, and the like. For example, in the case of transition from a normal operation state to a clock gating state, the PMU 193 stops generation of the clock signal GCLK1.

For example, in the case of transition from a normal operation state to a resting state, the PMU 193 performs voltage and/or frequency scaling. For example, when the voltage scaling is performed, the PMU 193 turns off the power switch 210 and turns on the power switch 211 to input the voltage VDD1 to the CPU core 200. The voltage VDD1 is a voltage at which data in the scan flip-flop 221 is not lost. When the frequency scaling is performed, the PMU 193 reduces the frequency of the clock signal GCLK1.

In the case where the CPU core 200 transitions from a normal operation state to a power gating state, data in the scan flip-flop 221 is backed up to the backup circuit 222. When the CPU core 200 is returned from the power gating state to the normal operation state, recovery operation of writing back data in the backup circuit 222 to the scan flip-flop 221 is performed.

Figure 14:
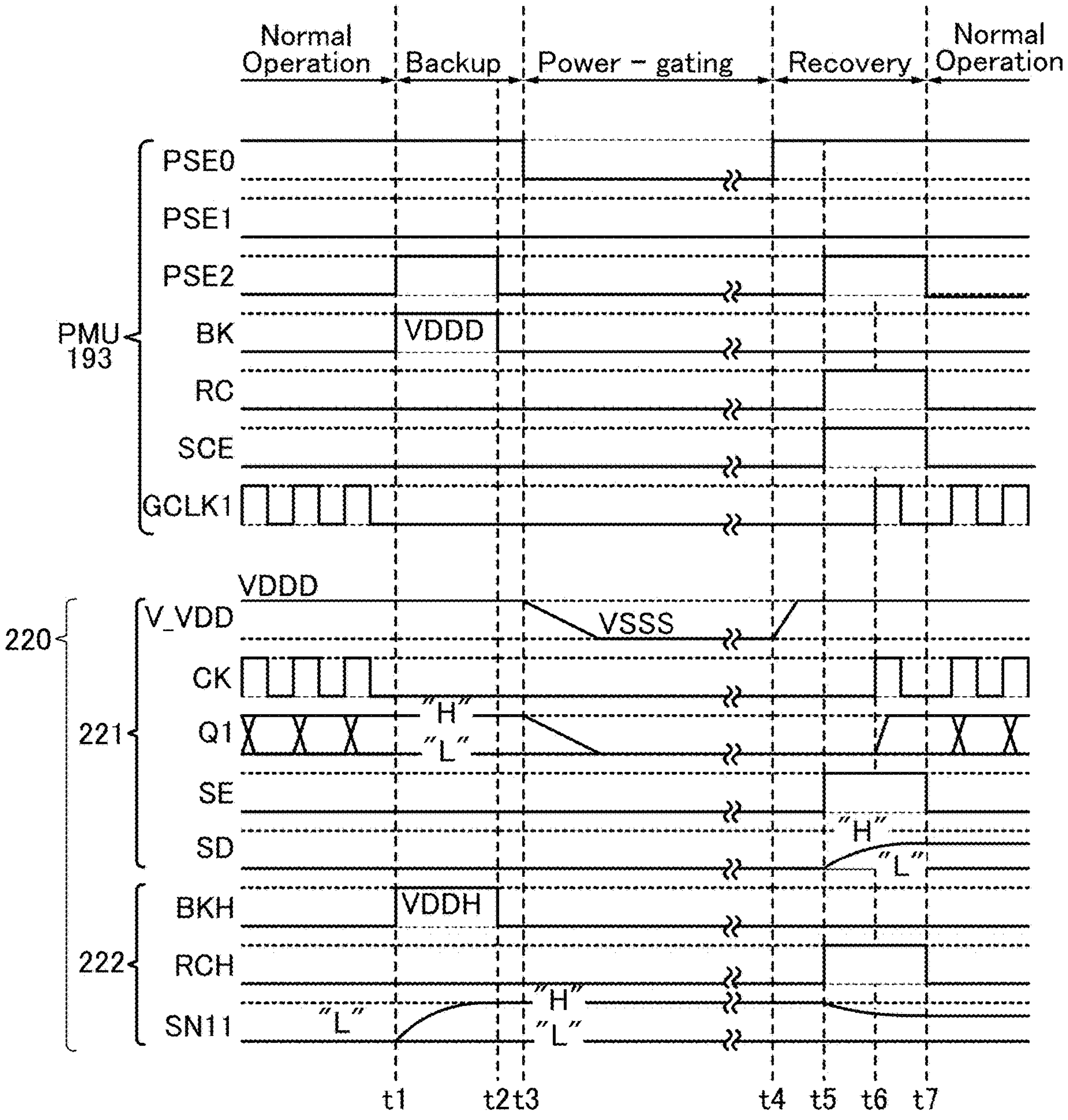
FIG. 14 is a diagram illustrating a configuration example of a CPU.

FIG. 14 illustrates an example of the power gating sequence of the CPU core 200. Note that in FIG. 14, t1 to t7 represent the time. Signals PSE0 to PSE2 are control signals of the power switches 210 to 212, which are generated in the PMU 193. When the signal PSE0 is at “H”/“L”, the power switch 210 is on/off. The same applies also to the signals PSE1 and PSE2.

Until time t1, a normal operation is performed. The power switch 210 is on, and the voltage VDDD is input to the CPU core 200. The scan flip-flop 221 performs the normal operation. At this time, the level shifter 214 does not need to be operated; thus, the power switch 212 is off and the signals SCE, BK, and RC are each at “L”. The node SE is at “L”; thus, the scan flip-flop 221 stores data in the node D1. Note that in the example of FIG. 14, the node SN11 of the backup circuit 222 is at “L” at time t1.

A backup operation is described. At operation time t1, the PMU 193 stops the clock signal GCLK1 and sets the signals PSE2 and BK at "H". The level shifter 214 becomes active and outputs the signal BKH at "H" to the backup circuit 222.

The transistor M11 in the backup circuit 222 is turned on, and data in the node Q1 of the scan flip-flop 221 is written to the node SN11 of the backup circuit 222. When the node Q1 of the scan flip-flop 221 is at "L", the node SN11 remains at "L", whereas when the node Q1 is at "H", the node SN11 becomes "H".

The PMU 193 sets the signals PSE2 and BK at "L" at time t2 and sets the signal PSE0 at "L" at time t3. The state of the CPU core 200 transitions to a power gating state at time t3. Note that at the timing when the signal BK falls, the signal PSE0 may fall.

A power-gating operation is described. When the signal PSE0 is set at "L, data in the node Q1 is lost because the voltage of the V_VDD line decreases. The node SN11 retains data that is stored in the node Q1 at time t3.

A recovery operation is described. When the PMU 193 sets the signal PSE0 at "H" at time t4, the power gating state transitions to a recovery state. Charging of the V_VDD line starts, and the PMU 193 sets the signals PSE2, RC, and SCE at "H" in a state where the voltage of the V_VDD line becomes VDDD (at time t5).

The transistor M12 is turned on, and electric charge in the capacitor C11 is distributed to the node SN11 and the node SD. When the node SN11 is at "H", the voltage of the node SD increases. The node SE is at "H", and thus, data in the node SD is written to a latch circuit on the input side of the scan flip-flop 221. When the clock signal GCLK1 is input to the node CK at time t6, data in the latch circuit on the input side is written to the node Q1. That is, data in the node SN11 is written to the node Q1.

When the PMU 193 sets the signals PSE2, SCE, and RC at "L" at time t7, the recovery operation is terminated.

The backup circuit 222 using an OS transistor is extremely suitable for normally-off computing because both dynamic power consumption and static power consumption are low. Note that the CPU 10 including the CPU core 200 including the backup circuit 222 using an OS transistor can be referred to as NoffCPU (registered trademark). The NoffCPU includes a nonvolatile memory, and power supply to the NoffCPU can be stopped during the time when the NoffCPU does not need to operate. Even when the flip-flop 220 is mounted, a decrease in the performance and an increase in the dynamic power of the CPU core 200 can be made hardly to occur.

Note that the CPU core 200 may include a plurality of power domains capable of power gating. In the plurality of power domains, one or a plurality of power switches for controlling voltage input are provided. In addition, the CPU core 200 may include one or a plurality of power domains where power gating is not performed. For example, the power domain where power gating is not performed may be provided with a power gating control circuit for controlling the flip-flop 220 and the power switches 210 to 212.

Note that the application of the flip-flop 220 is not limited to the CPU 10. In the arithmetic device, the flip-flop 220 can be used as the register provided in a power domain capable of power gating.

This embodiment can be combined with the description of the other embodiments as appropriate.

Embodiment 4

In this embodiment, structures of transistors that can be used in the semiconductor device 100, the CPU 10, and the accelerator 20 described in the above embodiment are described. As an example, a structure in which transistors having different electrical characteristics are stacked is described. With the structure, the degree of freedom in design of the semiconductor device can be increased. Stacking transistors having different electrical characteristics can increase the degree of integration of the semiconductor device.

Figure 15:
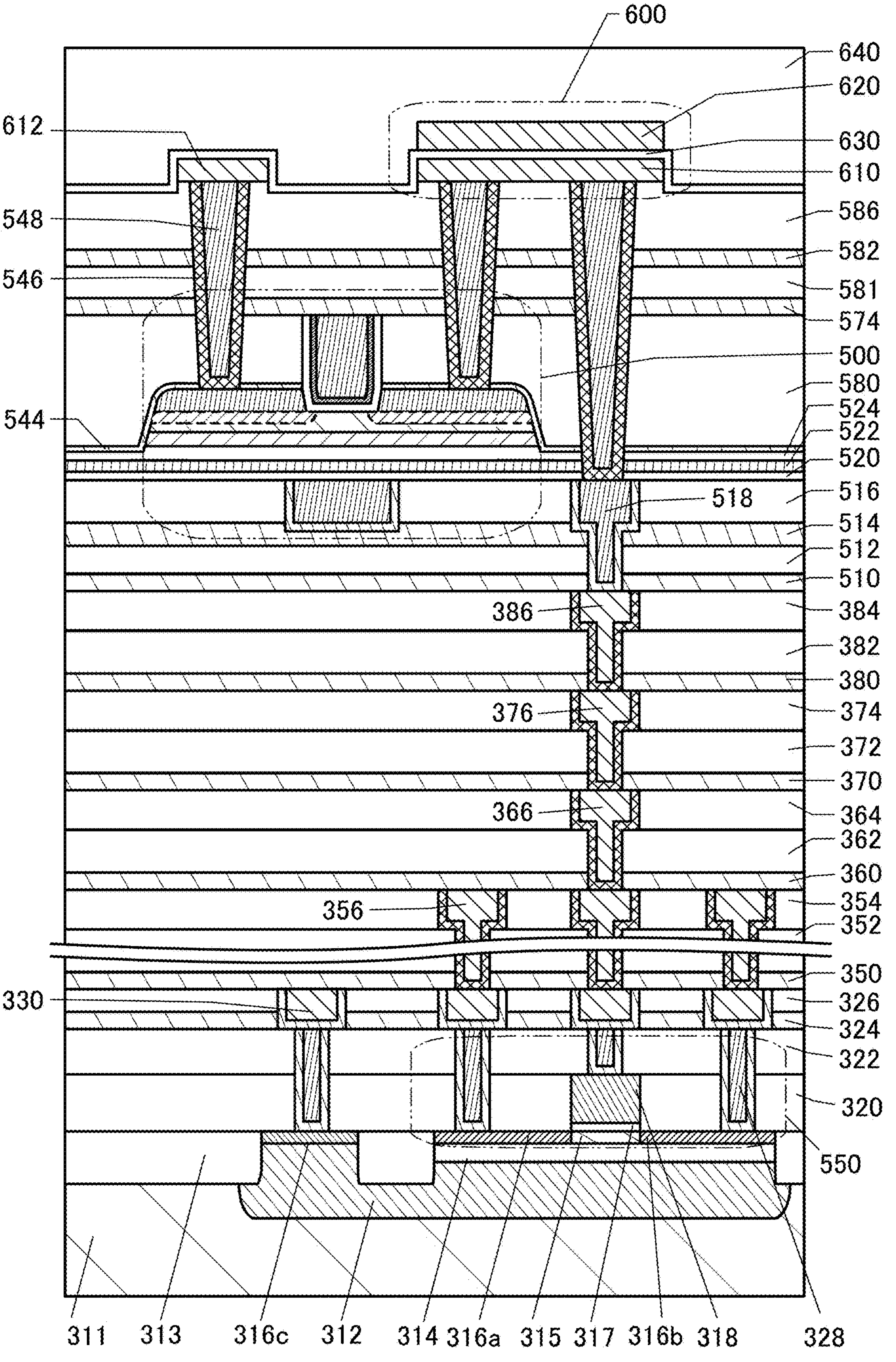
FIG. 15 is a diagram illustrating a structure example of a semiconductor device.
Figure 16A:
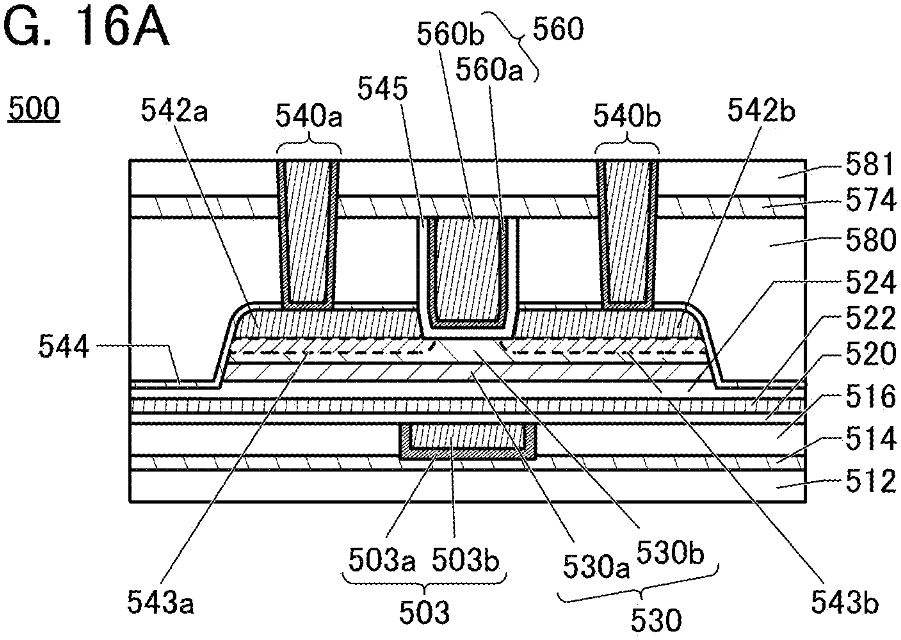
FIG. 16A and FIG. 16B are diagrams showing a structure example of a transistor.
Figure 16B:
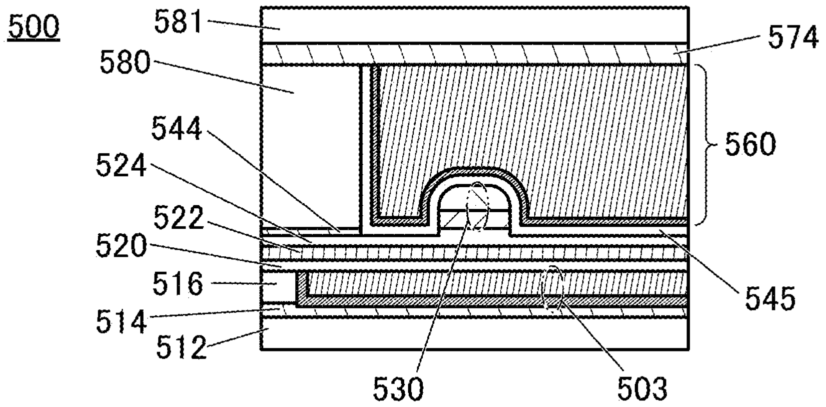

FIG. 15 shows part of a cross-sectional structure of a semiconductor device. The semiconductor device illustrated in FIG. 15 includes a transistor 550, a transistor 500, and a capacitive element 600. FIG. 16A is a cross-sectional view of the transistor 500 in the channel length direction, and FIG. 16B is a cross-sectional view of the transistor 500 in the channel width direction. For example, the transistor 500 corresponds to the transistors 32 to 34 described in the above embodiment, and the transistor 550 corresponds to a Si transistor included in the arithmetic circuit 23. The capacitive element 600 corresponds to the capacitor 35.

The transistor 500 is an OS transistor. The off-state current of an OS transistor is extremely low. Accordingly, data voltage or charge written to a storage node through the transistor 500 can be retained for a long time. In other words, power consumption of the semiconductor device can be reduced because the storage node (node MN) has a low frequency of refresh operation or requires no refresh operation.

In FIG. 15, the transistor 500 is provided above the transistor 550, and the capacitive element 600 is provided above the transistor 550 and the transistor 500.

The transistor 550 is provided on a substrate 311. The substrate 311 is a p-type silicon substrate, for example. The substrate 311 may be an n-type silicon substrate. An oxide layer 314 is preferably an insulating layer formed with an oxide buried (Burned oxide) into the substrate 311 (the insulating layer is also referred to as a BOX layer), for example, is a silicon oxide. The transistor 550 is formed using a single crystal silicon provided over the substrate 311 with the oxide layer 314 sandwiched therebetween; that is, the transistor 550 is provided on an SOI (Silicon On Insulator) substrate.

The substrate 311 included in the SOI substrate is provided with an insulator 313 serving as an element isolation layer. The substrate 311 includes a well region 312. The well region 312 is a region to which n-type or p-type conductivity is imparted in accordance with the conductivity of the transistor 550. The single-crystal silicon in the SOI substrate is provided with a semiconductor region 315 and a low-resistance region 316*a* and a low-resistance region 316*b* each of which function as a source region or a drain region. A low-resistant region 316*c* is provided over the well layer 312.

The transistor 550 can be provided so as to overlap with the well region 312 to which an impurity element imparting conductivity is added. The region 312 can function as a bottom-gate electrode of the transistor 550 by independently changing the potential of the low-resistance region 316*c*. Moreover, the threshold voltage of the transistor 550 can be controlled. In particular, when a negative potential is applied to the well region 312, the threshold voltage of the transistor 550 can be further increased, and the off-state current can be reduced. Thus, a negative potential is applied to the well region 312, so that a drain current when a potential applied to a gate electrode of the Si transistor is 0 V can be reduced. As a result, power consumption due to shoot-through current or the like in the arithmetic circuit 23 including the transistor 550 can be reduced, and the arithmetic efficiency can be improved.

The transistor 550 preferably has a structure in which the top surface and the side surface in the channel width direction of the semiconductor layer are covered with a conductor 318 with an insulator 317 therebetween, that is, a Fin-type structure. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

The conductor 318 sometimes functions as a first gate (also referred to as a top gate) electrode. In addition, the well region 312 sometimes functions as a second gate (also referred to as a bottom gate) electrode. In that case, a potential applied to the well region 312 can be controlled through the low-resistance region 316*c*.

A region of the semiconductor region 315 where a channel is formed, a region in the vicinity thereof, the low-resistance region 316*a* and the low-resistance region 316*b* each functioning as a source region or a drain region, the low-resistance region 316*c* connected to an electrode controlling a potential of the well region 312, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with use of GaAs and GaAlAs, or the like.

The well region 312, the low-resistance region 316*a*, the low-resistance region 316*b*, and the low-resistance region 316*c* contain an element which imparts n-type conductivity, such as arsenic or phosphorus, or an element which imparts p-type conductivity, such as boron, in addition to the semiconductor material used for the semiconductor region 315.

For the conductor 318 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used. Alternatively, silicide such as nickel silicide may be used for the conductor 318.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

To form each of the low-resistance region 316*a*, the low-resistance region 316*b*, and the low-resistance region 316*c*, another conductor, for example, silicide such as nickel silicide may be stacked. With this structure, the conductivity of the region functioning as an electrode can be increased. At this time, an insulator functioning as a sidewall spacer (also referred to as a sidewall insulating layer) may be provided at the side surface of the conductor 318 functioning as a gate electrode and the side surface of the insulator functioning as a gate insulating film. This structure can prevent the conductor 318 and the low-resistance region 316*a* and the low-resistance region 316*b* from being brought into a conduction state.

An insulator 320, an insulator 322, an insulator 324, and an insulator 326 are stacked in this order to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10\times10^{15}$ atoms/$cm^2$, preferably less than or equal to $5\times10^{15}$ atoms/$cm^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

A conductor 328, a conductor 330, and the like that are connected to the capacitive element 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 15, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 15, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 15, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 15, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property against hydrogen or impurities diffused from the substrate 311, a region where the transistor 550 is provided, or the like into the region where the transistor 500 is provided. Therefore, a material similar to that for the insulator 324 can be used.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitive element 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 16A and FIG. 16B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap with a region between the conductor 542*a* and the conductor 542*b*; an insulator 545 positioned on a bottom surface and a side surface of an opening; and a conductor 560 positioned on a formation surface of the insulator 545.

In addition, as illustrated in FIG. 16A and FIG. 16B, an insulator 544 is preferably positioned between the insulator 580 and the oxide 530*a*, the oxide 530*b*, the conductor 542*a*, and the conductor 542*b*. Furthermore, as illustrated in FIG. 16A and FIG. 16B, the conductor 560 preferably includes a conductor 560*a* provided on an inner side than the insulator 545 and a conductor 560*b* provided to be embedded on the inner side of the conductor 560*a*. Moreover, as illustrated in FIG. 16A and FIG. 16B, an insulator 574 is preferably positioned over the insulator 580, the conductor 560, and the insulator 545.

Note that in this specification and the like, the oxide 530*a* and the oxide 530*b* are sometimes collectively referred to as an oxide 530.

Note that although a structure of the transistor 500 in which two layers of the oxide 530*a* and the oxide 530*b* are stacked in a region where a channel is formed and its vicinity is illustrated, the present invention is not limited thereto. For example, it is possible to employ a structure in which a single layer of the oxide 530*b* or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 15, FIG. 16A and FIG. 16B is an example, and the structures are not limited thereto; an appropriate transistor can be used in accordance with a circuit configuration or a driving method.

Here, the conductor 560 functions as a gate electrode of the transistor, and the conductor 542*a* and the conductor 542*b* each function as a source electrode or a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as a top gate) electrode. In addition, the conductor 503 sometimes functions as a second gate (also referred to as a bottom gate) electrode. In that case, the threshold voltage of the transistor 500 can be controlled by changing a potential applied to the conductor 503 not in synchronization with but independently of a voltage applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503*a* is formed in contact with an inner wall of an opening in the insulator 514 and the insulator 516, and a conductor 503*b* is formed on the inner side. Note that although the transistor 500 having a structure in which the conductor 503*a* and the conductor 503*b* are stacked is shown, the present invention is not limited thereto. For example, the conductor 503 may be provided as a single layer or to have a stacked-layer structure of three or more layers.

For the conductor 503*a*, a conductive material having a function of preventing diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503*a* has a function of inhibiting diffusion of oxygen, a reduction in conductivity of the conductor 503*b* due to oxidation can be inhibited.

In addition, in the case where the conductor 503 also functions as a wiring, a conductive material with high conductivity that contains tungsten, copper, or aluminum as its main component is preferably used for the conductor 503*b*. Note that although the conductor 503 is illustrated to have a stacked layer of the conductor 503*a* and the conductor 503*b* in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \rightarrow V_O$+H" occurs. Part of hydrogen generated at this time is bonded to oxygen to be $H_2O$, and removed from the oxide 530 or an insulator in the vicinity of the oxide 530 in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O$+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba,Sr)$TiO_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIG. 16A and FIG. 16B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With use of a metal oxide having such a wide band gap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530*a* is preferably higher than the atomic ratio of the element M to the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*.

The energy of the conduction band minimum of the oxide 530*a* is preferably higher than the energy of the conduction band minimum of the oxide 530*b*. In other words, the electron affinity of the oxide 530*a* is preferably smaller than the electron affinity of the oxide 530*b*.

Here, the energy level of the conduction band minimum gently changes at a junction portion of the oxide 530*a* and the oxide 530*b*. In other words, the energy level of the conduction band minimum at the junction portion of the oxide 530*a* and the oxide 530*b* continuously changes or is continuously connected. This can be obtained by decreasing the density of defect states in a mixed layer formed at the interface between the oxide 530*a* and the oxide 530*b*.

Specifically, when the oxide 530_a_ and the oxide 530_b_ contain a common element (as a main component) in addition to oxygen, a mixed layer with a low density of defect states can be formed. For example, in the case where the oxide 530_b_ is an In—Ga—Zn oxide, an In—Ga—Zn oxide, a Ga—Zn oxide, gallium oxide, or the like is used as the oxide 530_a_.

At this time, the oxide 530_b_ serves as a main carrier path. When the oxide 530_a_ has the above-described structure, the density of defect states at the interface between the oxide 530_a_ and the oxide 530_b_ can be made low. Thus, the influence of interface scattering on carrier conduction is small, and the transistor 500 can have a high on-state current.

The conductor 542_a_ and the conductor 542_b_ functioning as the source electrode and the drain electrode are provided over the oxide 530_b_. For the conductor 542_a_ and conductor 542_b_, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

In addition, although the conductor 542_a_ and the conductor 542_b_ each having a single-layer structure are shown in FIG. 16A, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as shown in FIG. 16A, a region 543_a_ and a region 543_b_ are sometimes formed as low-resistance regions at an interface between the oxide 530 and the conductor 542_a_ (the conductor 542_b_) and in the vicinity of the interface. In that case, the region 543_a_ functions as one of a source region and a drain region, and the region 543_b_ functions as the other of the source region and the drain region. Furthermore, the channel formation region is formed in a region between the region 543_a_ and the region 543_b_.

When the conductor 542_a_ (the conductor 542_b_) is provided to be in contact with the oxide 530, the oxygen concentration in the region 543_a_ (the region 543_b_) sometimes decreases. In addition, a metal compound layer that contains the metal contained in the conductor 542_a_ (the conductor 542_b_) and the component of the oxide 530 is sometimes formed in the region 543_a_ (the region 543_b_). In such a case, the carrier density of the region 543_a_ (the region 543_b_) increases, and the region 543_a_ (the region 543_b_) becomes a low-resistance region.

The insulator 544 is provided to cover the conductor 542_a_ and the conductor 542_b_ and inhibits oxidation of the conductor 542_a_ and the conductor 542_b_. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542_a_ and the conductor 542_b_ are oxidation-resistant materials or do not significantly lose their conductivity even after absorbing oxygen. Design is appropriately determined in consideration of required transistor characteristics.

When the insulator 544 is included, diffusion of impurities such as water and hydrogen contained in the insulator 580 into the oxide 530_b_ through the insulator 545 can be inhibited. Furthermore, oxidation of the conductor 560 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530_b_. Furthermore, as in the insulator 524, the concentration of impurities such as water or hydrogen in the insulator 545 is preferably reduced. The thickness of the insulator 545 is preferably greater than or equal to 1 nm and less than or equal to 20 nm. After and/or formation of the insulator 545, the above-described microwave treatment may be performed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is shown in FIG. 16A and FIG. 16B, a single-layer structure or a stacked-layer structure of three or more layers may be employed.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material that has a function of inhibiting the diffusion of oxygen (e.g., at least one of an oxygen atom, an oxygen molecule, and the like). When the conductor 560*a* has a function of inhibiting diffusion of oxygen, a reduction in conductivity of the conductor 560*b* due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560*a*, the oxide semiconductor that can be used as the oxide 530 can be used. In that case, when the conductor 560*b* is deposited using a sputtering method, the conductor 560*a* can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560*b*. Furthermore, the conductor 560*b* also functions as a wiring and thus a conductor having high conductivity is preferably used as the conductor 560*b*. For example, a conductive material containing tungsten, copper, or aluminum as its main component can be used. The conductor 560*b* may have a stacked-layer structure, for example, a stacked-layer structure of any of the above conductive materials and titanium or titanium nitride.

The insulator 580 is provided over the conductor 542*a* and the conductor 542*b* with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structure of the conductor 540*a* and the conductor 540*b* are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitive element 600, the transistor 500, or the transistor 550. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitive element 600 is provided above the transistor 500. The capacitive element 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitive element 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. For the insulator 640, a material similar to that for the insulator 320 can be used. In addition, the insulator 640 may function as a planarization film that covers an uneven shape therebelow.

With use of this structure, a semiconductor device using a transistor including an oxide semiconductor can be miniaturized or highly integrated.

<Variation 1 of Transistor>

Figure 17A:
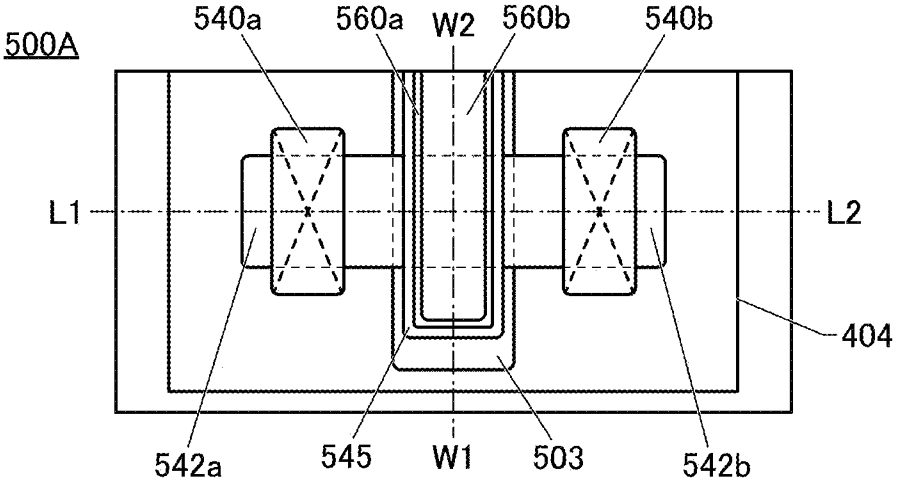
FIG. 17A to FIG. 17C are diagrams illustrating a transistor structure example.
Figure 17B:
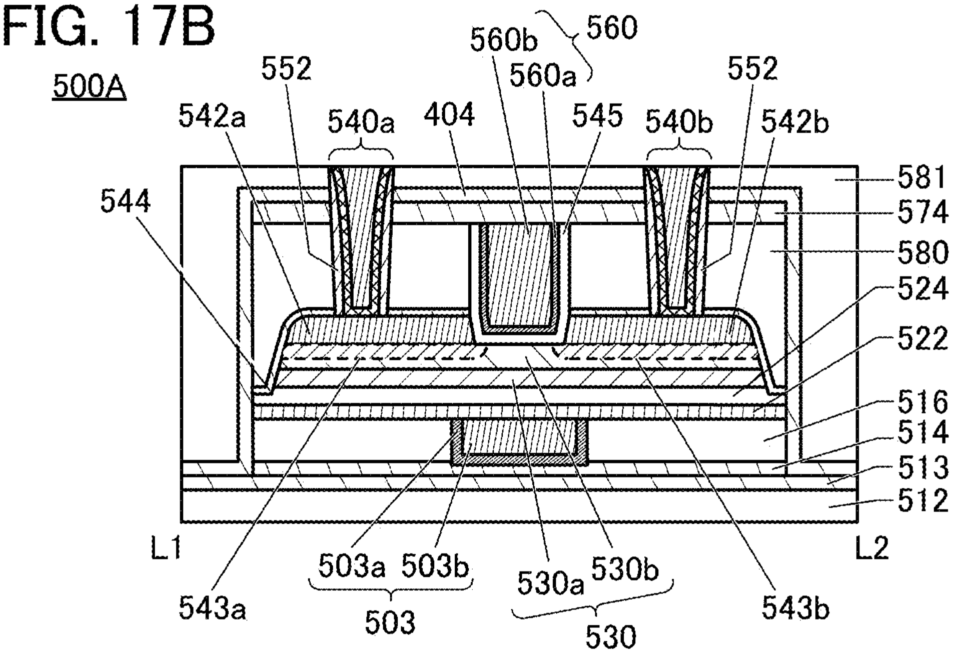
Figure 17C:
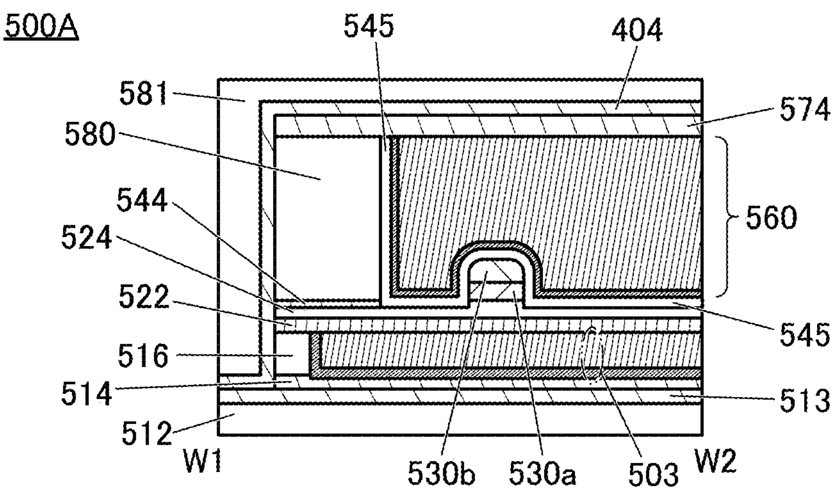

A transistor 500A illustrated in FIG. 17A, FIG. 17B, and FIG. 17C is a variation example of the transistor 500 having the structure illustrated in FIG. 16A and FIG. 16B. FIG. 17A is a top view of the transistor 500A, FIG. 17B is a cross-sectional view of the transistor 500A in the channel length direction, and FIG. 17C is a cross-sectional view of the transistor 500A in the channel width direction. Note that for clarity of the drawing, some components are not shown in the top view of FIG. 17A. The structure illustrated in FIG. 17A, FIG. 17B, and FIG. 17C can also be used for other transistors such as the transistor 550 included in the semiconductor device of one embodiment of the present invention.

The transistor 500A having the structure illustrated in FIG. 17A, FIG. 17B, and FIG. 17C is different from the transistor 500 having the structure illustrated in FIG. 16A and FIG. 16B in that an insulator 552, an insulator 513, and an insulator 404 are included. Furthermore, the transistor 500A is different from the transistor 500 having the structure illustrated in FIG. 16A and FIG. 16B in that the insulator 552 is provided in contact with a side surface of the conductor 540*a* and a side surface of the conductor 540*b*. Moreover, the transistor 500A is different from the transistor 500 having the structure shown in FIG. 16A and FIG. 16B in that the insulator 520 is not included.

In the transistor 500A having the structure illustrated in FIG. 17A, FIG. 17B, and FIG. 17C, the insulator 513 is provided over the insulator 512. The insulator 404 is provided over the insulator 574 and the insulator 513.

In the transistor 500A having the structure illustrated in FIG. 17A, FIG. 17B, and FIG. 17C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water or hydrogen from the insulator 580 and the like into the oxide 530 through the conductor 540*a* and the conductor 540*b*. Furthermore, oxygen contained in the insulator 580 can be inhibited from being absorbed by the conductor 540*a* and the conductor 540*b*. As described above, the reliability of the semiconductor device of one embodiment of the present invention can be increased.

<Variation 2 of Transistor>

Figure 18A:
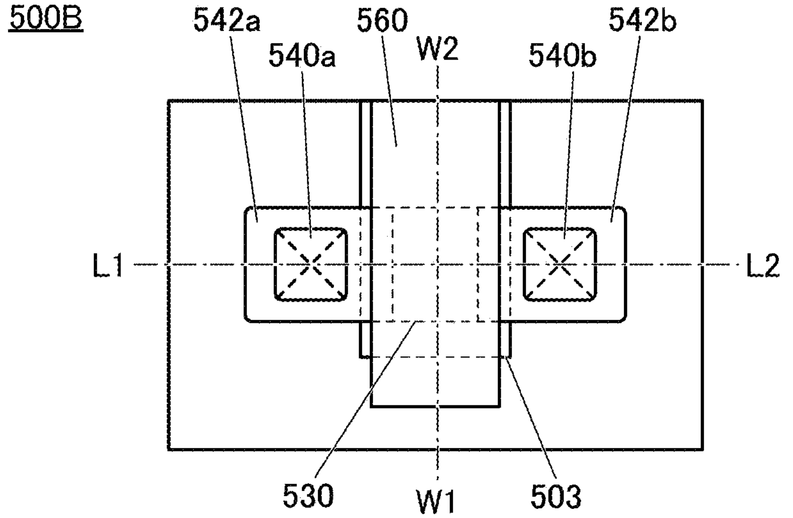
FIG. 18A to FIG. 18C are diagrams illustrating a transistor structure example.
Figure 18B:
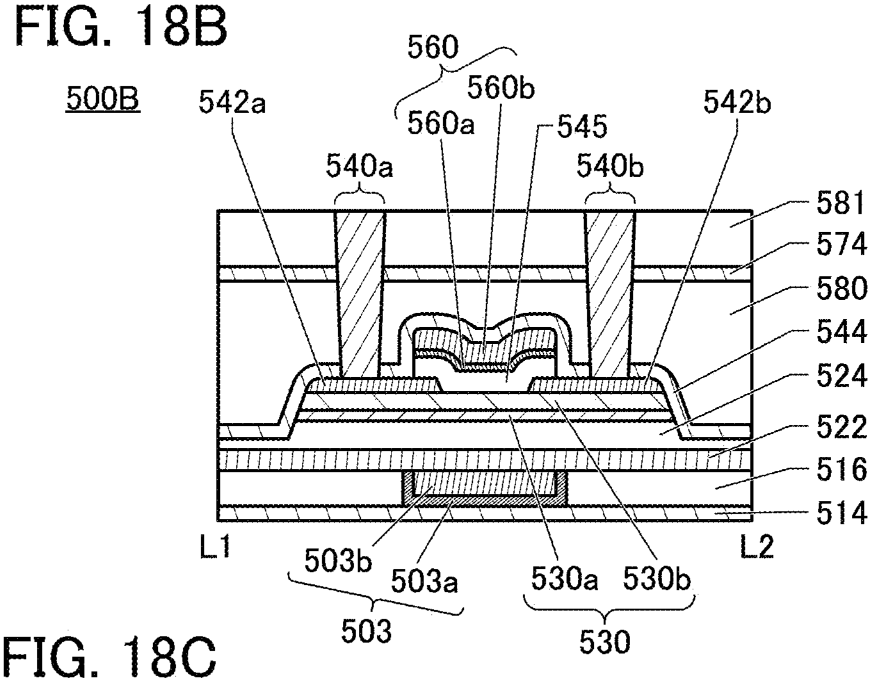
Figure 18C:
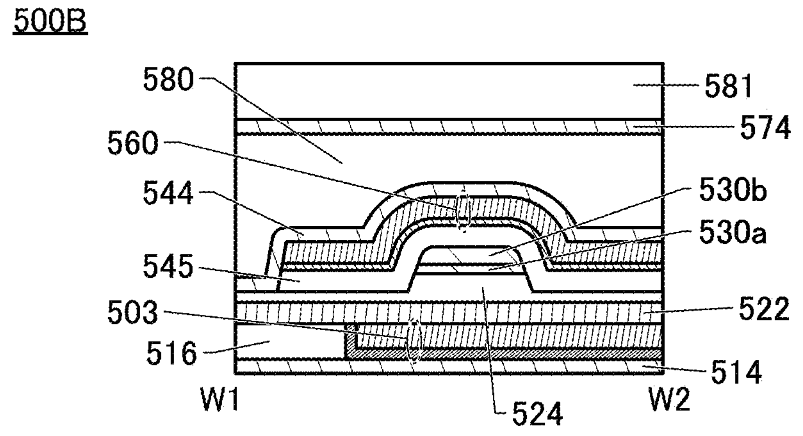

A structure example of a transistor 500B is described with reference to FIG. 18A, FIG. 18B, and FIG. 18C. FIG. 18A is a top view of the transistor 500B. FIG. 18B is a cross-sectional view of a portion indicated by dashed-dotted line L1-L2 in FIG. 18A. FIG. 18C is a cross-sectional view of a portion indicated by a dashed-dotted line W1-W2 in FIG. 18A. Note that for clarity of the drawing, some components are not shown in the top view of FIG. 18A.

The transistor 500B is a variation example of the transistor 500 and can be replaced with the transistor 500. Therefore, differences of the transistor 500B from the transistor 500 will be mainly described to avoid repeated description.

The conductor 560 functioning as a first gate electrode includes the conductor 560*a* and the conductor 560*b* over the conductor 560*a*. For the conductor 560*a*, a conductive material that has a function of inhibiting diffusion of impurities such as a hydrogen atom, a hydrogen molecule, a water molecule, and a copper atom is preferably used. Alternatively, it is preferable to use a conductive material that has a function of inhibiting the diffusion of oxygen (e.g., at least one of an oxygen atom, an oxygen molecule, and the like).

When the conductor 560*a* has a function of inhibiting oxygen diffusion, the range of choices for the material of the conductor 560*b* can be extended. That is, the conductor 560*a* inhibits oxidation of the conductor 560*b*, thereby preventing the decrease in conductivity.

The insulator 544 is preferably provided to cover the top surface and the side surface of the conductor 560 and a side surface of the insulator 545. For the insulator 544, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping with part of the conductor 542*a* and part of the conductor 542*b*, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

The composition, structure, method, and the like described in this embodiment can be used in combination as appropriate with the compositions, structures, methods, and the like described in the other embodiments, the example, and the like.

Embodiment 5

In this embodiment, crystal structures of an oxide semiconductor and the like are described in detail.

[Classification of Crystal Structure]

First, classifications of the crystal structures of an oxide semiconductor will be described with reference to FIG. 19A. FIG. 19A is a diagram showing the classification of crystal structures of an oxide semiconductor, typically IGZO (a metal oxide containing In, Ga, and Zn).

As shown in FIG. 19A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 19A are in an intermediate state between "Amorphous" and "Crystal", and belong to a new boundary region (New crystalline phase). That is, these structures are completely different from "Amorphous," which is energetically unstable, and "Crystal."

Note that a crystal structure of a film or a substrate can be evaluated with an X-ray diffraction (XRD) spectrum. FIG. 19B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 19B and obtained by GIXD measurement is hereinafter simply referred to as an XRD spectrum. The CAAC-IGZO film in FIG. 19B has a composition in the vicinity of In:Ga:Zn=4:2:3 [atomic ratio]. The CAAC-IGZO film in FIG. 19B has a thickness of 500 nm.

As shown in FIG. 19B, a clear peak indicating crystallinity is detected in the XRD spectrum of the CAAC-IGZO film. Specifically, a peak indicating c-axis alignment is detected at 2θ that is around 31° in the XRD spectrum of the CAAC-IGZO film. As shown in FIG. 19B, the peak at 2θ that is around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 19C shows a diffraction pattern of the CAAC-IGZO film. FIG. 19C shows a diffraction pattern obtained with the NBED method in which an electron beam is incident in the direction parallel to the substrate. The composition of the CAAC-IGZO film in FIG. 19C is in the vicinity of In:Ga:Zn=4:2:3 [atomic ratio]. In the nanobeam electron diffraction method, electron diffraction is performed with a probe diameter of 1 nm.

As shown in FIG. 19C, a plurality of spots indicating c-axis alignment are observed in the diffraction pattern of the CAAC-IGZO film.

[Structure of Oxide Semiconductor]

Oxide semiconductors might be classified in a manner different from that in FIG. 19A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ that is 31° that or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

[Composition of Oxide Semiconductor]

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration of the channel formation region of the oxide semiconductor is preferably lower than or equal to $1\times10^{18}$ $cm^{-3}$, further preferably lower than $1\times10^{17}$ $cm^{-3}$, still further preferably lower than $1\times10^{16}$ $cm^{-3}$, yet further preferably lower than $1\times10^{13}$ $cm^{-3}$, yet still further preferably lower than $1\times10^{12}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurity]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in a channel formation region of the oxide semiconductor and the concentration of silicon or carbon in the vicinity of an interface with the channel formation region of the oxide semiconductor (the concentration measured by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal is likely to have normally-on characteristics. Thus, the concentration of an alkali metal or an alkaline earth metal in the channel formation region of the oxide semiconductor, which is measured by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Thus, the concentration of nitrogen in the channel formation region of the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. For this reason, hydrogen in the channel formation region of the oxide semiconductor is preferably reduced as much as possible. Specifically, the hydrogen concentration in the channel formation region of the oxide semiconductor, which is measured by SIMS, is lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for the channel formation region of the transistor, stable electrical characteristics can be given.

The composition, structure, method, and the like described in this embodiment can be used in combination as appropriate with the compositions, structures, methods, and the like described in the other embodiments, the example, and the like.

Embodiment 6

In this embodiment, a structure of an integrated circuit including the components of the semiconductor device 100 described in the above embodiment will be described with reference to FIG. 20 and FIG. 21.

Figure 20:
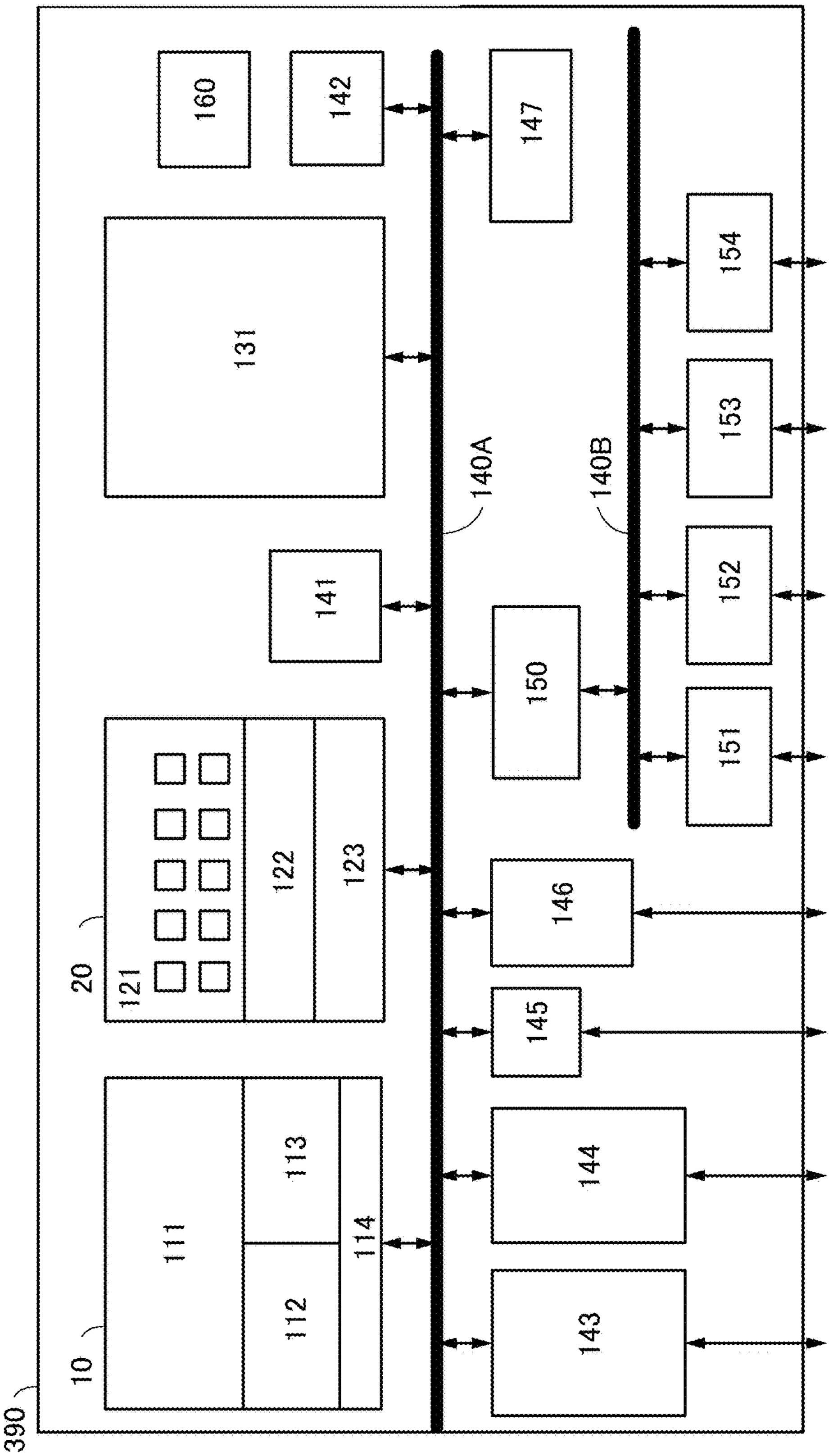
FIG. 20 is a diagram illustrating a structure example of an integrated circuit.

FIG. 20 is an example of a block diagram illustrating the structure example of the integrated circuit including the components of the semiconductor device 100.

An integrated circuit 390 illustrated in FIG. 20 includes the CPU 10, the accelerator 20, an on-chip memory 131, a DMAC (Direct Memory Access Controller) 141, a power supply circuit 160, a power management unit (PMU) 142, a security circuit 147, a memory controller 143, a DDR SDRAM (Double Data Rate Synchronous Dynamic Random Access Memory) controller 144, a USB (Universal Serial Bus) interface circuit 145, a display interface circuit 146, a bridge circuit 150, an interrupt control circuit 151, an interface circuit 152, a battery control circuit 153, and an ADC (Analog-to-digital converter)/DAC (Digital-to-analog converter) interface circuit 154.

The CPU 10 includes a CPU core 111, an instruction cache 112, a data cache 113, and a bus interface circuit 114, for example. The accelerator 20 includes a memory circuit 121, an arithmetic circuit 122, and a driver circuit 123.

The CPU core 111 includes a plurality of CPU cores. The instruction cache 112 can have a circuit structure in which an instruction executed by the CPU core 111 is temporarily stored. The data cache 113 can have a circuit structure in which data processed by the CPU core 111 or data obtained by the processing is temporarily stored. The bus interface circuit 114 can have a circuit structure that can transmit and receive signals such as data and an address to and from a bus for connecting the CPU 10 and another circuit in the semiconductor device.

The memory circuit 121 corresponds to the memory circuit 24 described in Embodiment 1. The memory circuit 121 can have a circuit structure in which data processed by the accelerator 20 is stored. The arithmetic circuit 122 corresponds to the arithmetic circuit 23 described in Embodiment 1. The arithmetic circuit 122 can have a circuit structure in which an arithmetic operation of data retained in the memory circuit 121 is performed. The driver circuit 123 corresponds to a structure with the driver circuit 15 described in Embodiment 1. The driver circuit 123 can have a circuit structure as illustrated in FIG. 9B, which controls the circuits in the accelerator 20.

A high-speed bus 140A is a bus for transmitting and receiving at high speed various signals between the CPU 10, the accelerator 20, the on-chip memory 131, the DMAC 141, the power management unit 142, the security circuit 147, the memory controller 143, the DDR SDRAM controller 144, the USB interface circuit 145, and the display interface circuit 146. As an example, an AMBA (Advanced Micro-controller Bus Artcitecture)-AHB (Advanced High-performance Bus) can be used as a bus.

The on-chip memory 131 has a circuit structure for storing data or a program that is input into and output from the circuit included in the integrated circuit 390, for example, the CPU 10 or the accelerator 20.

The DMAC 141 is a direct memory access controller. With the DMAC 141, a peripheral device other than the CPU 10 can access the on-chip memory 131 without through the CPU 10.

The power management unit 142 has a circuit structure for controlling power gating of circuits such as the CPU core included in the integrated circuit 390.

The security circuit 147 has a circuit structure for improving confidentiality of signals in such a manner that signals are transmitted and received between the integrated circuit 390 and an external circuit after being encrypted.

The memory controller 143 has a circuit structure for writing or reading out a program to be executed by the CPU 10 or the accelerator 20 from a program memory outside the integrated circuit 390.

The DDR SDRAM controller 144 has a circuit structure for writing or reading out data to or from a main memory, such as a DRAM, outside the integrated circuit 390.

The USB interface circuit 145 has a circuit structure for transmitting and receiving data to and from a circuit outside the integrated circuit 390 through a USB port.

The display interface circuit 146 has a circuit structure for transmitting and receiving data to and from a display device outside the integrated circuit 390.

The power supply circuit 160 is a circuit for generating a voltage used in the integrated circuit 390. For example, it is a circuit that generates a negative voltage supplied to a back gate of an OS transistor for stabilizing electrical characteristics.

A low-speed bus 140B is a bus for transmitting and receiving at low speed various signals between the interrupt control circuit 151, the interface circuit 152, the battery control circuit 153, and the ADC/DAC interface circuit 154. As an example, an AMBA-APB (Advanced Peripheral Bus) can be used as the bus. Transmission and reception of various signals between the high-speed bus 140A and the low-speed bus 140B are performed through the bridge circuit 150.

The interrupt control circuit 151 has a circuit structure for performing interrupt processing in response to a request received from a peripheral device.

The interface circuit 152 has a circuit structure for operating an interface such as a UART (Universal Asynchronous Receiver/Transmitter), an I2C (Inter-Integrated Circuit), or an SPI (Serial Peripheral Interface).

The battery control circuit 153 has a circuit structure for transmitting and receiving data related to charging and discharging of a battery outside the integrated circuit 390.

The ADC/DAC interface circuit 154 has a circuit structure for transmitting and receiving data to and from a device outside the integrated circuit 390 that outputs an analog signal, such as a MEMS (Micro Electro Mechanical Systems) device.

Figure 21A:
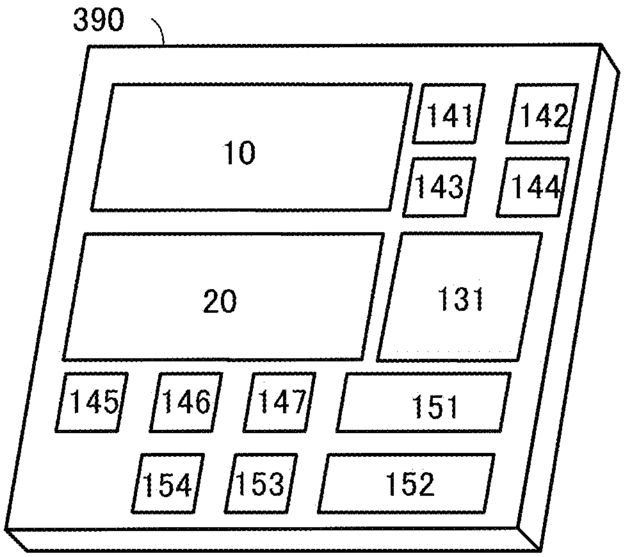
FIG. 21A and FIG. 21B are diagrams each illustrating a structure example of an integrated circuit.
Figure 21B:
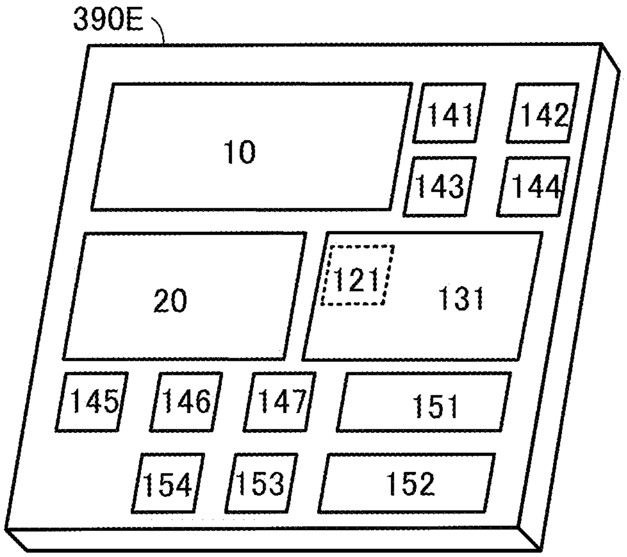

FIG. 21A and FIG. 21B are diagrams each illustrating an arrangement example of the circuit blocks when they are made into an SoC. As in the integrated circuit 390 illustrated in FIG. 21A, the components illustrated in the block diagram of FIG. 20 can be arranged on a chip by being divided into regions.

Note that the on-chip memory 131 illustrated in FIG. 20 can be configured with a memory circuit including an OS memory, for example, a NOSRAM. That is, the on-chip memory 131 and the memory circuit 121 have the same circuit structures. Therefore, when the SoC is made, the on-chip memory 131 and the memory circuit 121 can be arranged in the same region by being integrated as in an integrated circuit 390E illustrated in FIG. 21B.

According to one embodiment of the present invention described above, a novel semiconductor device and electronic device can be provided. Alternatively, according to one embodiment of the present invention, a semiconductor device and an electronic device having low power consumption can be provided. Alternatively, according to one embodiment of the present invention, a semiconductor device and an electronic device capable of suppressing heat generation can be provided.

This embodiment can be combined with the description of the other embodiments as appropriate.

Embodiment 7

In this embodiment, an electronic device, a moving object, and an arithmetic system to which the integrated circuit 390 described in the above embodiment can be applied will be described with reference to FIG. 22 to FIG. 25.

Figure 22B:
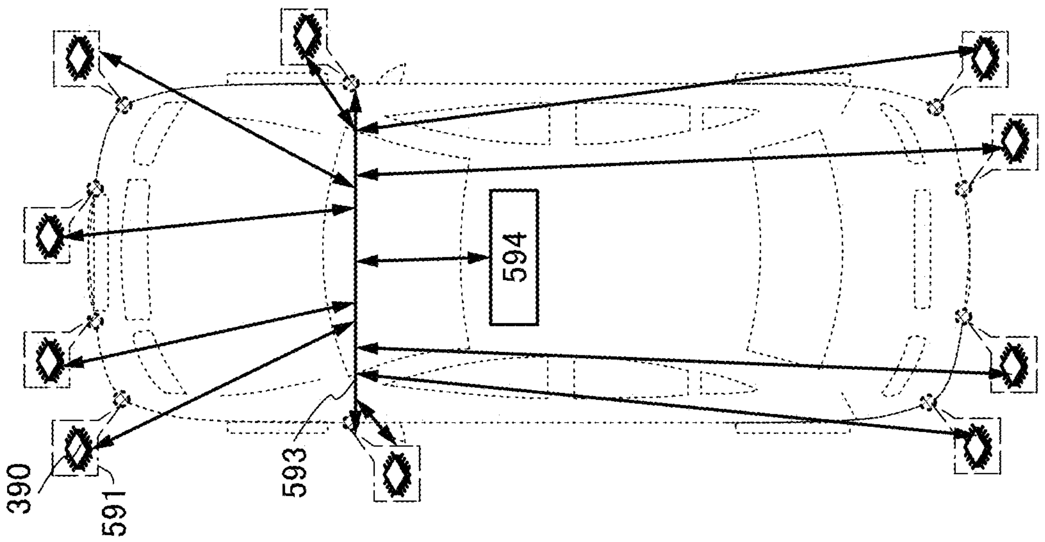
FIG. 22A and FIG. 22B are diagrams each illustrating an application example of an integrated circuit.
Figure 22A:
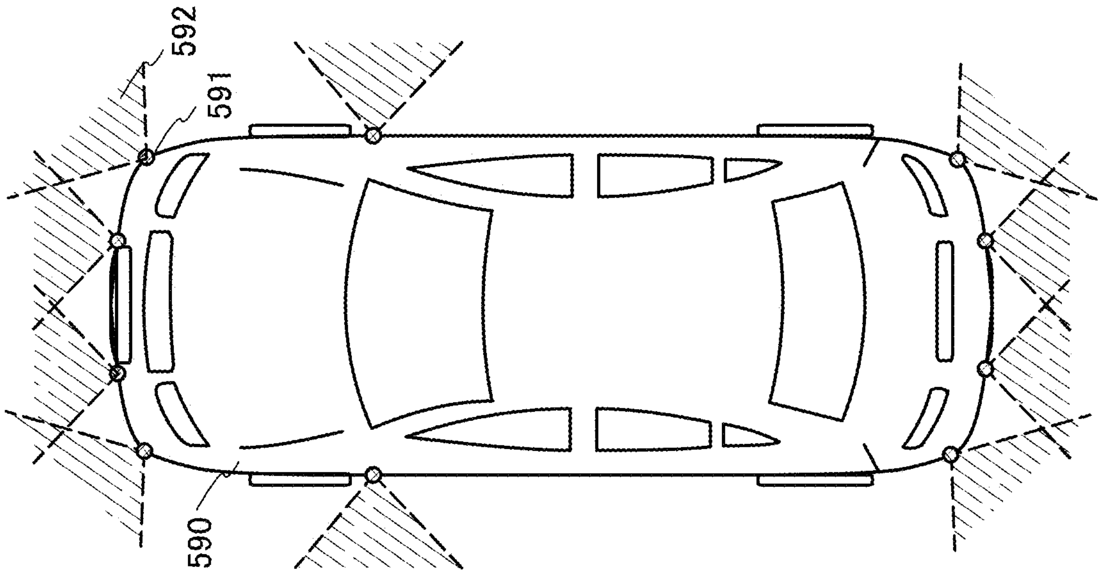

FIG. 22A illustrates an external view of an automobile as an example of a moving object. FIG. 22B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 can be used for the camera 591 and the like. The automobile 590 can perform autonomous driving by judging surrounding traffic information such as the presence of a guardrail or a pedestrian in such a manner that the camera 591 processes a plurality of images taken in a plurality of imaging directions 592 with the integrated circuit 390 described in the above embodiment and the plurality of images are analyzed together with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving vehicle, the moving vehicle is not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with the semiconductor device of one embodiment of the present invention.

Figure 23B:
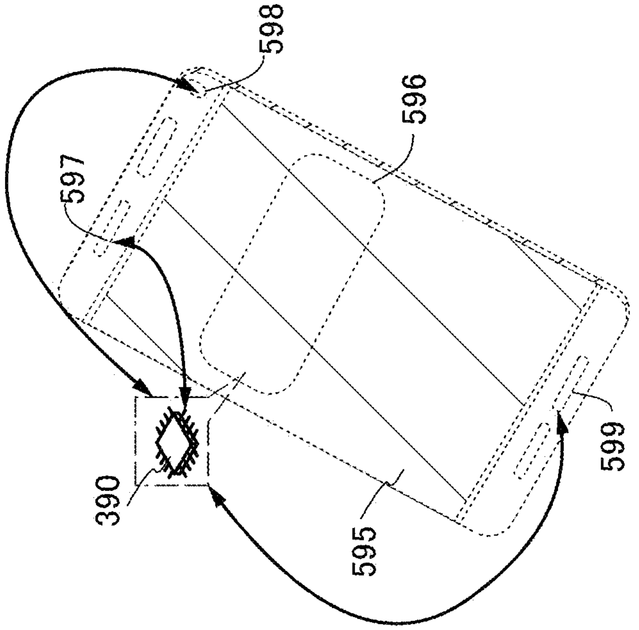
FIG. 23A and FIG. 23B are diagrams each illustrating an application example of an integrated circuit.
Figure 23A:
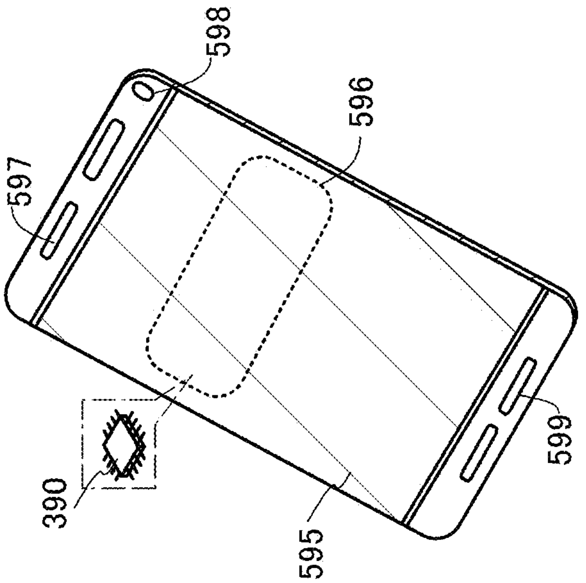

FIG. 23A is an external diagram illustrating an example of a portable electronic device. FIG. 23B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved. The integrated circuit 390 can be used for a system for voice guidance, image search, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 24A:
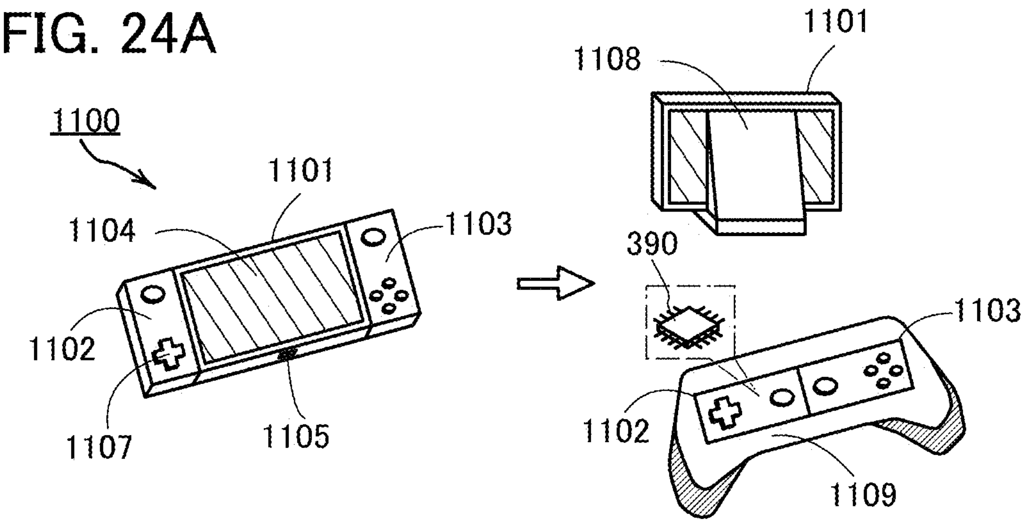
FIG. 24A, FIG. 24B, and FIG. 24C are diagrams each illustrating an application example of an integrated circuit.

A portable game machine 1100 illustrated in FIG. 24A includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, an image to be output to the display portion 1104 can be output to another video device. Alternatively, the housing 1102 and the housing 1103 are attached to a housing 1109, whereby the housing 1102 and the housing 1103 are integrated and function as an operation portion. The integrated circuit 390 described in the above embodiment can be incorporated into a chip provided on a substrate in the housing 1102 and the housing 1103, for example.

Figure 24B:
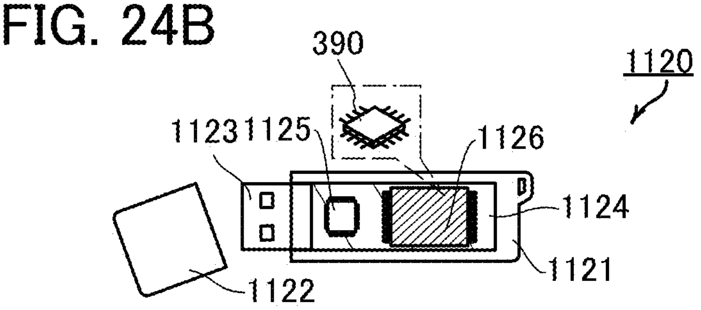

FIG. 24B is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The integrated circuit 390 described in the above embodiment can be incorporated into the controller chip 1126 or the like of the substrate 1124.

Figure 24C:
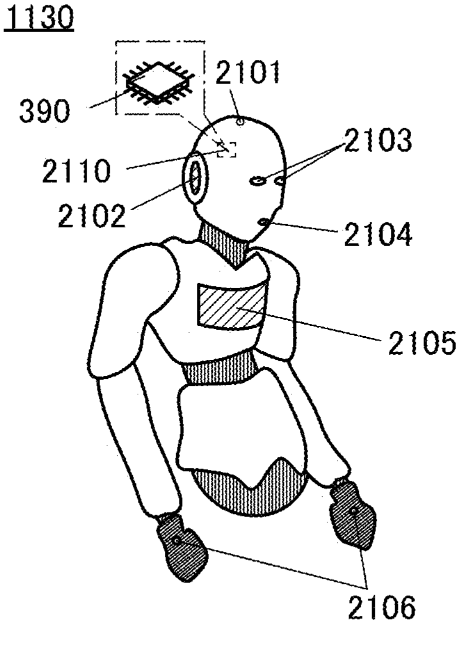

FIG. 24C is a humanoid robot 1130. The robot 1130 includes sensors 2101 to 2106 and a control circuit 2110. For example, the integrated circuit 390 described in the above embodiment can be incorporated into the control circuit 2110.

Figure 25:
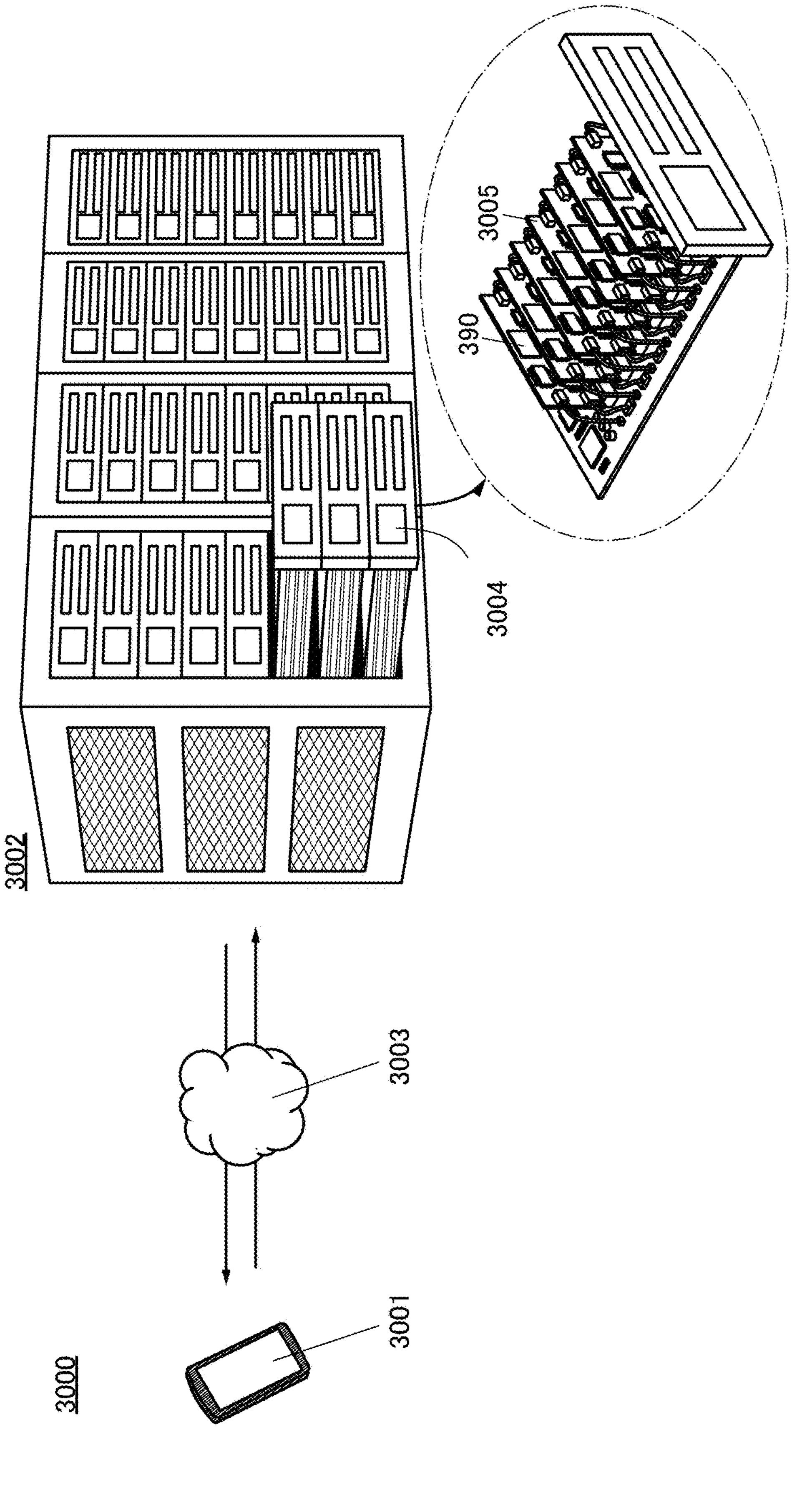
FIG. 25 is a diagram illustrating an application example of an integrated circuit.

The integrated circuit 390 described in the above embodiment can be used for a server that communicates with the electronic devices instead of being incorporated into the electronic devices. In that case, the arithmetic system is configured with the electronic devices and a server. FIG. 25 shows a configuration example of a system 3000.

The system 3000 includes an electronic device 3001 and a server 3002. Communication between the electronic device 3001 and the server 3002 can be performed through Internet connection 3003.

The server 3002 includes a plurality of racks 3004. The plurality of racks are provided with a plurality of substrates 3005, and the integrated circuit 390 described in the above embodiment can be mounted on each of the substrates 3005. Thus, a neural network is configured in the server 3002. The server 3002 can perform an arithmetic operation of the neural network using data input from the electronic device 3001 through the Internet connection 3003. The result of the arithmetic operation executed by the server 3002 can be transmitted as needed to the electronic device 3001 through the Internet connection 3003. Accordingly, a burden of the arithmetic operation in the electronic device 3001 can be reduced.

This embodiment can be combined with the description of the other embodiments as appropriate.

Example 1

This example relates to the accelerator having significantly better processing performance, which is described in Embodiment 1, and describes results of simulation for estimating arithmetic efficiency of the accelerator.

In data used for the simulation, the Si technology and the IGZO technology of transistors included in the accelerator were respectively assumed to be 55 nm and 60 nm. Parasitic capacitance was added in each layout. The arithmetic efficiency was estimated assuming the case where all neurons (memory circuits) in the neural network were activated, that is, power consumed by the product-sum operation in the neural network was maximum. Note that in the estimation, the number of memory circuits (memory cells) connected to one bit line was assumed as follows: 16 cells, 32 cells, 64 cells, and 128 cells.

As a specific calculation example, the following estimate can be made for the case of 32 cells/bit: (2048(PE)×2 (two types of product-sum operations))×(50 MHz)/(2048 (PE)×20.2 fJ×(50 MHz))=99 TOPS/W. Note that 2048 (PE) corresponds to the number of arithmetic circuits on which arithmetic processing can be performed at a time, that is, the number of columns of the memory cell arrays. 20.2 fJ is the total energy that is the sum of the read energy (13.9 fJ) from the memory cells and the product-sum operation energy (6.3 fJ) required for the product-sum operation.

Figure 26:
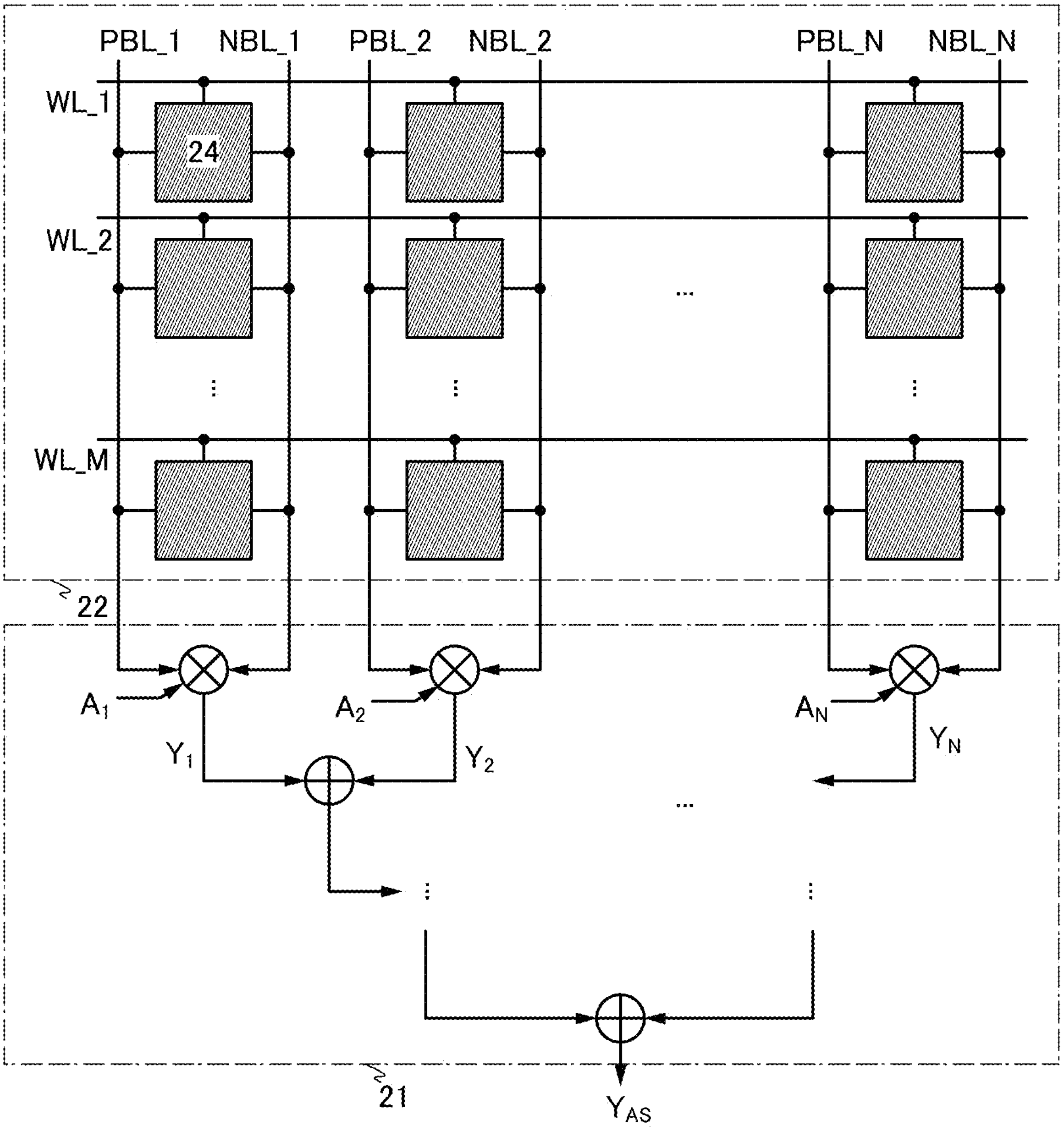
FIG. 26 is a diagram for describing Example of the present invention.

In other words, in the case of a circuit diagram shown in FIG. 26, the arithmetic efficiency was estimated assuming that the number of columns of the memory circuits 24 (PE) was 2048. In the case of FIG. 26, charge and discharge were conducted on two types of bit lines, that is the bit lines PBL_1 to PBL_N and the bit lines NBL_1 to NBL_N, and as the number of the memory cells connected to one bit line increased, the read energy from the memory cell (corresponding to the memory portion 22) increased. Independent of the number of memory cells connected to one bit line, the product-sum operation energy (corresponding to the energy of the arithmetic processing portion 21) can be estimated to be 6.3 fJ.

As another component, FIG. 26 illustrates word lines WL_1 to WL_M. In the arithmetic processing portion where the product-sum operation is conducted, a plurality of logic blocks for multiplication and a plurality of logic blocks for addition are shown. In the logic block for multiplication, signals from the bit lines PBL and NBL and the input data $A_1$ are input, and multiplied data $Y_1$ to $Y_N$ is obtained. Then, the data $Y_1$ to $Y_N$ is added up, and consequently the data YAS is obtained through the product-sum operation.

The above is summarized in Table 4. Table 4 shows the arithmetic efficiency estimated in the case where the number of memory cells was assumed as 16 cells, 32 cells, 64 cells, and 128 cells.

TABLE 4

| Number of memory cells | Energy for reading data of memory cell | Energy for product-sum operation of data | Total energy | Arithmetic efficiency |
|---|---|---|---|---|
| 16 cells | 8.4 fJ | 6.3 fJ | 14.7 fJ | 136 TOPS/W |
| 32 cells | 13.9 fJ | 6.3 fJ | 20.2 fJ | 99 TOPS/W |
| 64 cells | 25.0 fJ | 6.3 fJ | 31.3 fJ | 64 TOPS/W |
| 128 cells | 47.0 fJ | 6.3 fJ | 53.3 fJ | 38 TOPS/W |

Table 4 indicates that an arithmetic efficiency of 100 TOPS/W or more can be expected with use of the semiconductor device of one embodiment of the present invention.

SUPPLEMENTARY NOTES ON THE DESCRIPTION IN THIS SPECIFICATION AND THE LIKE

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, a content described in the embodiment is a content described with reference to a variety of drawings or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch is in a conduction state (on state) or in a non-conduction state (off state) to determine whether current flows or not. Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms “film”, “layer”, and the like can be interchanged with each other depending on the case or according to circumstances. For example, the term “conductive layer” can be changed into the term “conductive film” in some cases. As another example, the term “insulating film” can be changed into the term “insulating layer” in some cases.

REFERENCE NUMERALS

M11: transistor, M12: transistor, M13: transistor, 10: CPU, 11: CPU core, 12: backup circuit, 15: driver circuit, 20: accelerator, 21: arithmetic processing portion, 22: memory portion, 22_N: memory portion, 22_1: memory portion, 22_6: memory portion, 23: arithmetic circuit, 23_N: arithmetic circuit, 23_1: arithmetic circuit, 23_6: arithmetic circuit, 24: memory circuit, 25: transistor, 27: transistor, 29: semiconductor layer, 30: bus, 31: data retention circuit, 31_N: data retention circuit, 31_P: data retention circuit, 32: transistor, 32_N: transistor, 32_P: transistor, 33: transistor, 33_N: transistor, 33_P: transistor, 34: transistor, 35: capacitor, 42: logic circuit, 43: accumulator, 44: latch circuit, 45: encoding circuit, 50: neuron, 51: layer, 52: layer, 53: layer, 54: layer, 61: controller, 62: row decoder, 63: word line driver, 64: column decoder, 65: write driver, 66: precharge circuit, 71: input buffer, 72: arithmetic control circuit, 100: semiconductor device, 111: CPU core, 112: instruction cache, 113: data cache, 114: bus interface circuit, 121: memory circuit, 122: arithmetic circuit, 123: driver circuit, 131: on-chip memory, 140A: high-speed bus, 140B: low-speed bus, 141: DMAC, 142: power management unit, 143: memory controller, 144: controller, 145: interface circuit, 146: display interface circuit, 147: security circuit, 150: bridge circuit, 151: control circuit, 152: interface circuit, 153: battery control circuit, 154: interface circuit, 160: power supply circuit, 193: PMU, 200: CPU core, 202: cache memory device, 203: cache memory device, 205: bus interface portion, 210: power switch, 211: power switch, 212: power switch, 214: level shifter, 220: flip-flop, 221: scan flip-flop, 221A: clock buffer circuit, 222: backup circuit, 311: substrate, 312: well region, 313: insulator, 314: oxide layer, 315: semiconductor region, 316*a*: low-resistance region, 316*b*: low-resistance region, 316*c*: low-resistance region, 317: insulator, 318: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 390: integrated circuit, 390E: integrated circuit, 404: insulator, 500: transistor, 500A: transistor, 500B: transistor, 503: conductor, 503*a*: conductor, 503*b*: conductor, 510: insulator, 512: insulator, 513: insulator, 514: insulator, 516: insulator, 518: conductor, 520: insulator, 522: insulator, 524: insulator, 526: insulator, 530: oxide, 530*a*: oxide, 530*b*: oxide, 540*a*: conductor, 540*b*: conductor, 542: conductor, 542*a*: conductor, 542*b*: conductor, 543*a*: region, 543*b*: region, 544: insulator, 545: insulator, 546: conductor, 548: conductor, 550: transistor, 552: insulator, 560: conductor, 560*a*: conductor, 560*b*: conductor, 574: insulator, 580: insulator, 581: insulator, 582: insulator, 586: insulator, 590: automobile, 591: camera, 592: imaging direction, 593: bus, 594: host controller, 595: portable electronic device, 596: printed wiring board, 597: speaker, 598: camera, 599: microphone, 600: capacitive element, 610: conductor, 612: conductor, 620: conductor, 630: insulator, 640: insulator, 910: region, 912: region, 914: electric power, 916: electric power, 918: electric power, 920: electric power, 922: electric power, 1100: portable game machine, 1101: housing, 1102: housing, 1103: housing, 1104: display portion, 1105: connection portion, 1107: operation key, 1108: housing, 1109: housing, 1120: electronic device, 1121: housing, 1122: cap, 1123: USB connector, 1124: substrate, 1125: memory chip, 1126: controller chip, 1130: robot, 2101: sensor, 2106: sensor, 2110: control circuit, 3000: system, 3001: electronic device, 3002: server, 3003: Internet connection, 3004: rack, 3005: substrate

The invention claimed is:

1. A semiconductor device comprising:
a CPU; and
an accelerator,
wherein the accelerator comprises a first memory circuit, a driver circuit, and a product-sum operation circuit,
wherein the first memory circuit comprises a first data retention portion, a second data retention portion, and a data reading portion,
wherein the first data retention portion, the second data retention portion, and the data reading portion each comprise a first transistor,
wherein the first transistor comprises a first semiconductor layer comprising a metal oxide in a channel formation region,
wherein first data stored in the first data retention portion and second data stored in the second data retention portion are each weight data input to the product-sum operation circuit,
wherein the product-sum operation circuit is configured to perform product-sum operation of the weight data and input data input through the driver circuit,
wherein the product-sum operation circuit and the driver circuit each comprise a second transistor,
wherein the second transistor comprises a second semiconductor layer comprising silicon in a channel formation region, and
wherein the first transistor and the second transistor are stacked.

2. The semiconductor device according to claim 1,
wherein the CPU comprises a CPU core comprising a flip-flop provided with a backup circuit,
wherein the backup circuit comprises a third transistor,
wherein the flip-flop comprises a fourth transistor,
wherein the third transistor comprises a third semiconductor layer comprising a metal oxide in a channel formation region,
wherein the fourth transistor comprises a fourth semiconductor layer comprising silicon in a channel formation region, and
wherein the third transistor and the fourth transistor are stacked.

3. The semiconductor device according to claim 2, wherein the backup circuit is configured to retain data stored in the flip-flop in a state where supply of a power supply voltage is stopped when the CPU does not operate.

4. The semiconductor device according to claim 1, wherein the first data retention portion and the second data retention portion are configured to store the first data and the second data when the first transistors are brought into an off state.

5. The semiconductor device according to claim 4, wherein the first memory circuit is electrically connected to a first bit line for reading the first data and a second bit line for reading the second data, and wherein the first bit line and the second bit line are electrically connected to the product-sum operation circuit through a first wiring perpendicular or substantially perpendicular to a surface of a substrate where the second transistor is provided.

6. The semiconductor device according to claim 1, wherein the metal oxide comprises In, Ga, and Zn.

7. A semiconductor device comprising:

a CPU; and an accelerator, wherein the accelerator comprises a first memory circuit, a driver circuit, and a product-sum operation circuit, wherein the first memory circuit comprises a first data retention portion, a second data retention portion, and a data reading portion, wherein the first data retention portion, the second data retention portion, and the data reading portion each comprise a first transistor, wherein the first transistor comprises a first semiconductor layer comprising a metal oxide in a channel formation region, wherein first data stored in the first data retention portion and second data stored in the second data retention portion are each weight data input to the product-sum operation circuit, wherein the product-sum operation circuit is configured to perform product-sum operation of the weight data and input data input through the driver circuit, wherein the product-sum operation circuit and the driver circuit each comprise a second transistor, wherein the second transistor comprises a second semiconductor layer comprising silicon in a channel formation region, a well region comprising an impurity element imparting conductivity, and an oxide layer in contact with the well region and the second semiconductor layer, and wherein the first transistor and the second transistor are stacked.

8. The semiconductor device according to claim 7, wherein the first data retention portion and the second data retention portion are configured to store the first data and the second data when the first transistors are brought into an off state.

9. The semiconductor device according to claim 8, wherein the first memory circuit is electrically connected to a first bit line for reading the first data and a second bit line for reading the second data, and wherein the first bit line and the second bit line are electrically connected to the product-sum operation circuit through a first wiring perpendicular or substantially perpendicular to a surface of a substrate where the second transistor is provided.

10. The semiconductor device according to claim 7, wherein the metal oxide comprises In, Ga, and Zn.

* * * * *